(12) United States Patent
Mochizuki et al.

(10) Patent No.: US 12,737,508 B2
(45) Date of Patent: Sep. 15, 2026

(54) CENTERLINE CORRECTION APPARATUS, CENTERLINE CORRECTION METHOD, AND SPATIAL NETWORK DATA GENERATION SYSTEM AND PROGRAM

(71) Applicant: NTT, Inc., Tokyo (JP)

(72) Inventors: Mitsuru Mochizuki, Musashino (JP); Hitoshi Seshimo, Musashino (JP); Osamu Matsuda, Musashino (JP)

(73) Assignee: NTT, Inc., Tokyo (JP)

( * ) Notice: Subject to any disclaimer, the term of this patent is extended or adjusted under 35 U.S.C. 154(b) by 1163 days.

(21) Appl. No.: 17/775,940

(22) PCT Filed: Nov. 11, 2019

(86) PCT No.: PCT/JP2019/044078
§ 371 (c)(1),
(2) Date: May 11, 2022

(87) PCT Pub. No.: WO2021/095086
PCT Pub. Date: May 20, 2021

(65) Prior Publication Data
US 2022/0382928 A1 Dec. 1, 2022

(51) Int. Cl.
*G06F 30/13* (2020.01)

(52) U.S. Cl.
CPC .................................... *G06F 30/13* (2020.01)

(58) Field of Classification Search
CPC ....... G06F 30/00; G06F 30/13; G01C 21/206; G01C 21/3819; G06T 11/20; G06T 11/60; G09B 29/00
USPC .............................................................. 703/1
See application file for complete search history.

(56) References Cited

U.S. PATENT DOCUMENTS 6,622,085 B1 9/2003 Amita et al.

FOREIGN PATENT DOCUMENTS

JP 2009230518 10/2009
WO WO 2000043953 7/2000

OTHER PUBLICATIONS

Haunert, Jan-Henrik et al., "Area Collapse and Road Centerlines based on Straight Skeletons", Aug. 17, 2007, Geoinformatica, Sprnger. (Year: 2007).*
Poullis, C. et al. "Delineation and geometric modeling of road networks", ISPRS Journal of Photogrammetry and Remote Sensing, Elsevier B.V. (Year: 2009).*

(Continued)

*Primary Examiner* — Cedric Johnson
(74) *Attorney, Agent, or Firm* — Fish & Richardson P.C.

(57) ABSTRACT

A centerline correction apparatus according to one embodiment corrects a centerline of a path that is acquired from shape information about an indoor space or road shape information about an outdoor space and that is a travelable region in the indoor space or the outdoor space. This centerline correction apparatus includes a centerline correction unit that performs: a center point extraction process that extracts a center point of an individual side of the centerline; a centerline correction process that moves the centerline to be at a center with respect to a distance to a boundary of an original shape based on the extracted center point; and an unnecessary centerline deletion process that deletes an unnecessary one of the moved centerlines.

6 Claims, 45 Drawing Sheets

(56) References Cited

OTHER PUBLICATIONS

Yang, Xiaofei et al., “Road Detection and Centerline Extraction Via Deep Recurrent Convolutional Neural Network U-Net”, Sep. 2019, IEEE Transactions on Geoscience and Remote Sensing, vol. 57, No. 9, IEEE. (Year: 2019).*

Mortari, “Automatic Extraction of Improved Geometrical Network Model from CityGML for Indoor navigation,” University of L’Aquila department of engineering and information sciences and mathematics degree course in computer engineering, Nov. 23, 2013, retrieved from URL <https://3d.bk.tudelft.nl/pdfs/FilippoMortari_thesis.pdf>, 139 pages.

Okuaki, “Method to Generate the Line data of the Road Centerline Automatically along with the Attribute Data of Width of Road,” Proceedings of the Geographic Information Systems Society, 2012, retrieved from URL <https://www.gisa-japan.org/conferences/proceedings/2012/papers/D-1-4.pdf>, 21:1-4, 9 pages (with English Translation).

* cited by examiner 46
45

CENTERLINE CORRECTION APPARATUS, CENTERLINE CORRECTION METHOD, AND SPATIAL NETWORK DATA GENERATION SYSTEM AND PROGRAM

CROSS-REFERENCE TO RELATED APPLICATIONS

This application is a National Stage application under 35 U.S.C. § 371 of International Application No. PCT/JP2019/044078, having an International Filing Date of Nov. 11, 2019, the disclosure of which is considered part of the disclosure of this application, and is incorporated in its entirety into this application.

TECHNICAL FIELD

Embodiments of the present invention relate to a centerline correction apparatus, a centerline correction method, a spatial network data generation system, and a program.

BACKGROUND ART

There are a plurality of techniques for generating a centerline needed when spatial network data is generated from shape information about an indoor space or road shape information about an outdoor space. For example, there are a method for utilizing the characteristics of a Delaunay triangulation (for example, Non Patent Literature 1), a method for utilizing the characteristics of a Voronoi diagram (for example, Non Patent Literature 2), a method for utilizing the characteristics of a reentrant vertex, etc. for a target space.

The centerlines generated by using these techniques have a large amount of data as they are and are not practical. Thus, simplification correction such as thinning out vertices is needed.

CITATION LIST

Patent Literature

[NPL 1] Filippo Mortari, "Automatic Extraction of Improved Geometrical Network Model from CityGML for Indoor navigation", https://3d.bk.tudelft.nl/pdfs/FilippoMortari_thesis.pdf

[NPL 2] Keiko OKUAKI, "Method to Generate the Linedata of the Road Centerline Automatically along with the Attribute Data of Width of Road", https://www.gisa-japan.org/conferences/proceedings/2012/papers/D-1-4.pdf

SUMMARY OF THE INVENTION

Technical Problem

However, in both of Non Patent Literatures 1 and 2, simplification such as thinning out of nodes is performed. With such a simplification correction technique, there has been an issue such that the centerline is corrected to be in an unnatural state, for example, the corrected centerline deviates from the center of a path such as an actual passage or road, a path configured by the centerlines becomes complex, etc.

An object of the present invention is to provide a technique capable of correcting a centerline to pass through the actual center of a path.

Means for Solving the Problem

To solve the above problem, a centerline correction apparatus according to one aspect of the present invention corrects a centerline of a path that is acquired from shape information about an indoor space or road shape information about an outdoor space and that is a travelable region in the indoor space or the outdoor space and includes a centerline correction unit that performs: a center point extraction process that extracts a center point of an individual side of the centerline; a centerline correction process that moves the centerline to be at a center with respect to a distance to a boundary of an original shape based on the extracted center point; and an unnecessary centerline deletion process that deletes an unnecessary one of the moved centerlines.

Effects of the Invention

According to one aspect of the present invention, there can be provided a technique capable of correcting a centerline to be a simple and natural centerline that passes through the center of a path, with as little increase of the number of vertices and data items of the centerline to be output as possible, by moving the centerline to be at the center with respect to a distance to the boundary of an original shape based on a center point of an individual side of the centerline and by deleting an unnecessary one of the moved centerlines.

DESCRIPTION OF EMBODIMENTS

Figure 1:
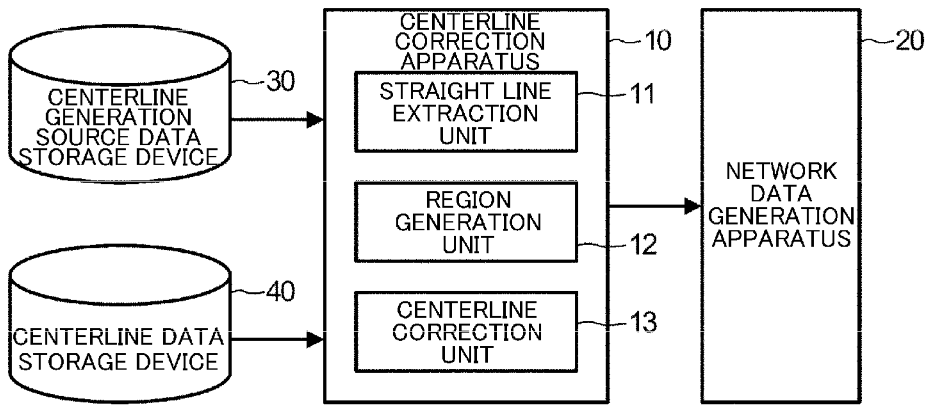
FIG. 1 is a block diagram illustrating an example of a configuration of a network data generation system including a centerline correction apparatus according to an embodiment of the present invention.

To facilitate understanding of the present invention, first, terms used in the present description will be described.

A"link" is a line drawn in a region where a moving object (person, wheelchair, stroller, robot, drone, etc.) can move assuming that the moving object moves on this line. Both ends of this link are always nodes. In addition to basic attribute information such as orientation and length, the link can have the characteristics, such as the height, width, level difference, number of steps, and presence of railings, of a region where the moving object can move as attribute information. When there is a branch in the middle of the link and the orientation of the link changes, a node is provided at the starting point of the change to divide the link.

A "node" is a point where a link starts or ends. The node is generated to change the orientation of the link (create a curve), to branch the link, etc. Further, when a navigation point is wished to be provided near a doorway, a node may be intentionally provided in the middle of the link so as to divide the link.

"POI" is an abbreviation for Point of Interest and manages a representative point for the shape of a space (store, room, toilet, etc.) and an attribute thereof.

"Network data" is a collective term for the links and nodes and serves as path information indicating a travelable path.

When an indoor space has "floor levels", "space", "room", "passage", "doorway", "floor connection" are managed separately for each floor level.

A "space" is a region obtained by dividing an indoor space into meaningful units (passages, rooms, etc.). This space is the travelable region to be a network data generation target.

A "room" is a space that can be a destination of a navigation point. When the number of doorways connected to the space is one, the space corresponds to a room. When the space has a shape of a convex polygon, the space also corresponds to a room.

A "passage" is a space for moving between rooms. When the number of doorways connected to the space is two or more and the space has a shape of a concave polygon (with holes), the space corresponds to a passage.

A "doorway" is a place (door, without a wall) that connects spaces.

"Floor Connection" is a place (stairs, elevator, escalator, etc.) that connects floor levels in the indoor space.

"Input data" refers to a digital blueprint used in construction. This input data indicates data created by architectural CAD (Computer Aided Design), BIM (Building Information Modeling), or the like.

"Architectural CAD" is software for creating drawings such as a plan view, an elevation view, a cross-sectional view, and a perspective view of a three-dimensional building such as a building and a structure. In the architectural CAD, walls and corridors, as well as pillars, stores, toilets, escalators, etc. can be divided into layers to be managed.

"BIM" manages a digital model including a three-dimensional building shape and attribute information. In IFC (Industry Foundation Classes), which is a format of BIM data, classes are defined for each of the structures such as floor levels, space, stairs, doors, and pillars.

A "Delaunay triangulation method" is a method for generating a centerline. In this method, Delaunay triangulation is performed on an original shape, the centers of bisectors of isosceles sides of the obtained isosceles triangle are connected, and the midpoints obtained therefrom are connected with each other to be used as a centerline.

A "Voronoi polygon method" is a method for generating a centerline. In this method, points are given at regular intervals on the sides of an original shape, Voronoi polygons are generated with these sets of points, and the adjacent polygons are merged. Of the sides of the merged polygons, the side located inside the original shape is used as a centerline.

Hereinafter, embodiments of the present invention will be described with reference to the drawings.

Configuration Example

FIG. 1 is a block diagram illustrating an example of a configuration of a network data generation system including a centerline correction apparatus 10 according to an embodiment of the present invention.

The network data generation system includes the centerline correction apparatus 10 and a network data generation apparatus 20 connected to this centerline correction apparatus 10. A centerline generation source data storage device 30 and a centerline data storage device 40 are connected to the centerline correction apparatus 10. The centerline correction apparatus 10 includes a straight line extraction unit 11, a region generation unit 12, and a centerline correction unit 13.

Typically, shape information about indoor spaces created when a building is designed, such as two-dimensional (hereinafter, referred to as 2D) architectural CAD data and a three-dimensional (hereinafter, referred to as 3D) model included in BIM data, is digital vector data. When BIM is used, a 3D model can be handled as 2D vector data by horizontally projecting the 3D model per floor level. This shape information is stored in the centerline generation source data storage device 30 as centerline generation source data.

A centerline is generated based on this shape information with focus on the characteristics of the shape, for example, by using the Delaunay triangulation method or the Voronoi polygon method, and the centerline simplified by simplification correction such as thinning out of vertices (nodes) is stored in the centerline data storage device 40. Any algorithm may be used for the generation and simplification correction of the centerline. Any centerline may be used on the premise that the centerline does not intersect the outer frame and inner frame of the shape of the indoor space to be processed, can be connected with a straight line from any internal position of the shape, and needs to be in an unbroken state.

The network data generation system may include a centerline acquisition apparatus that acquires a centerline from the shape information stored in the centerline generation source data storage device 30 and a centerline simplification apparatus that simplifies a centerline and stores the simplified centerline in the centerline data storage device 40.

The centerline correction apparatus 10 corrects a centerline by using the shape information stored in the centerline generation source data storage device 30 and the simplified centerline stored in the centerline data storage device 40 as input data. The network data generation apparatus 20 uses centerline correction data, which is a result of this centerline correction, as input data and generates network data.

Here, the straight line extraction unit 11 of the centerline correction apparatus 10 divides the outer frame shape of a passage, which is a travelable region in the indoor space, based on the shape information stored in the centerline generation source data storage device 30 and extracts straight line portions of this outer frame shape in order of length.

The region generation unit 12 groups the straight line portions, based on respective angles formed by the straight line portions extracted by the straight line extraction unit 11 and a reference line such as an X-axis or a Y-axis, and generates a region per group with a plurality of straight line portions included in each group.

The centerline correction unit 13 extracts a center point of an individual side of the centerline from the simplified centerline stored in the centerline data storage device 40. Next, based on the extracted center point and the shape information stored in the centerline generation source data storage device 30, the centerline correction unit 13 moves the centerline to be at the center with respect to a distance to the boundary of an original shape. For example, the centerline correction unit 13 rotates the individual side of the centerline around the center point and translates the rotated centerline. Further, the centerline correction unit 13 deletes any unnecessary one of the moved centerlines. The centerline correction unit 13 performs the above processing for each region of the group generated by the region generation unit 12.

Figure 2:
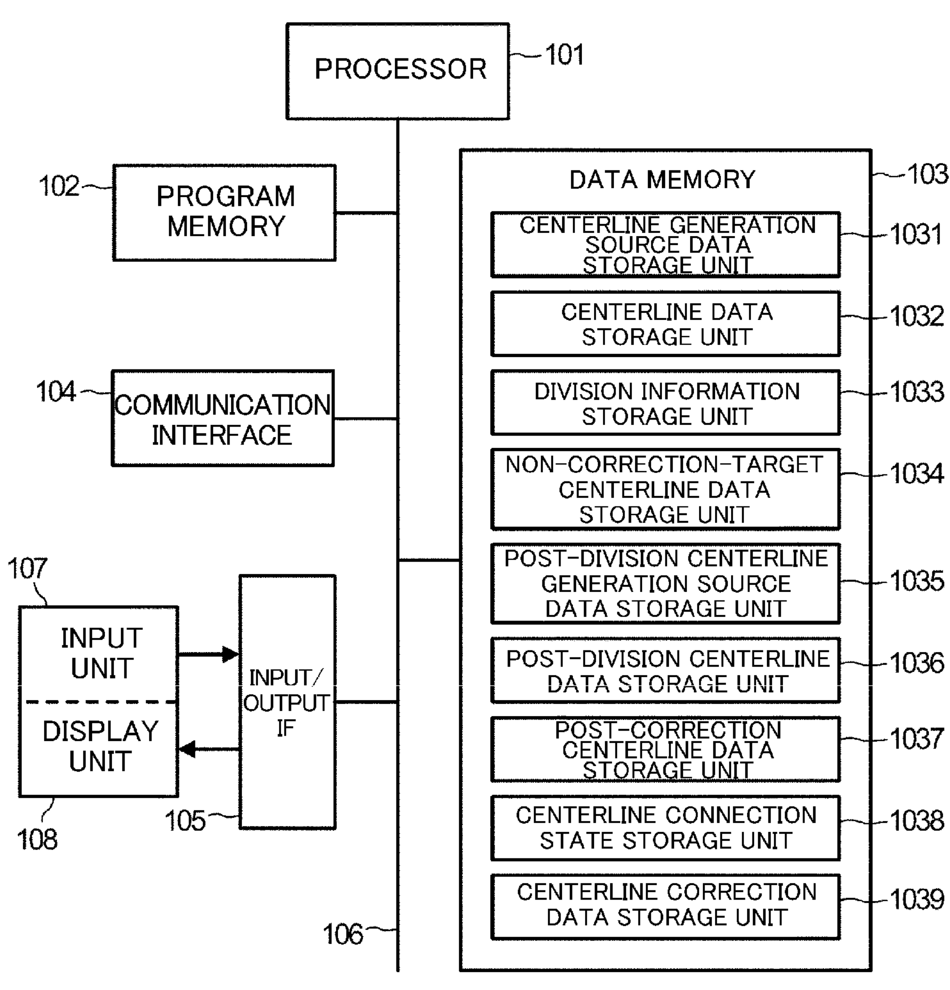
FIG. 2 is a diagram illustrating an example of a hardware configuration of the centerline correction apparatus.

FIG. 2 is a diagram illustrating an example of a hardware configuration of the centerline correction apparatus 10.

As illustrated in FIG. 2, for example, the centerline correction apparatus 10 is constituted by a computer such as a server computer or a personal computer and includes a hardware processor 101 such as a CPU (central processing unit). In the centerline correction apparatus 10, a program memory 102, a data memory 103, a communication interface 104, and an input/output interface (referred to as an input/output IF in FIG. 2) 105 are connected to the processor 101 via a bus 106.

The communication interface 104 can include, for example, one or more wired or wireless communication modules. When the centerline generation source data storage device 30 and/or the centerline data storage device 40 are/is configured by a data server or the like connected via a network such as a LAN (local area network) or the Internet, the communication interface 104 can acquire data from those storage devices by communicating with the data server or the like. When the network data generation apparatus 20 is configured by a data processing apparatus or the like connected via a network, the communication interface 104 can transmit centerline correction data, which is a result of the centerline correction, by communicating with the data processing apparatus or the like.

An input unit 107 and a display unit 108 are connected to the input/output interface 105. As the input unit 107 and the display unit 108, for example, a so-called tablet-type input and display device in which an input detection sheet adopting an electrostatic method or a pressure method is arranged on a display screen of a display device using, for example, a liquid crystal or an organic EL (electro luminescence) can be used. The input unit 107 and the display unit 108 may be configured as independent devices. The input/output interface 105 inputs operation information input via the above input unit 107 to the processor 101 and causes the display unit 108 to display the display information generated by the processor 101.

The input unit 107 and the display unit 108 do not need to be connected to the input/output interface 105. The input unit 107 and the display unit 108 can exchange information with the processor 101 by providing a communication unit for connecting to the communication interface 104 directly or via a network.

Further, the input/output interface 105 may have a read/write function of a recording medium, for example, a semiconductor memory such as a flash memory, or may have a function to connect to a reader/writer having a read/write function of such a recording medium. This allows a recording medium detachably attached to the centerline correction apparatus 10 to serve as the centerline generation source data storage device 30 and/or the centerline data storage device 40. The input/output interface 105 may further have a function to connect to another device, for example, to the network data generation apparatus 20.

The program memory 102 is, for example, a combination of a non-volatile memory that is writable and readable as needed such as an HDD (hard disk drive) or an SSD (solid state drive) and a non-volatile memory such as a ROM and used as a non-transitory tangible computer-readable storage medium. The program memory 102 stores a program needed for the processor 101 to execute various kinds of control processing according to an embodiment. That is, a processing function unit of each of the above straight line extraction unit 11, the region generation unit 12, and the centerline correction unit 13 is realized by causing the processor 101 to read and execute a program stored in the program memory 102. These processing function units may be partially or entirely implemented by various other forms including integrated circuits such as an application specific integrated circuit (ASIC) or an FPGA (field-programmable gate array).

The data memory 103 is, for example, a combination of the above-described non-volatile memory and a volatile memory such as a RAM (random access memory) and used as a tangible computer-readable storage medium. The data memory 103 is used for storing various kinds of data acquired and created in the process of performing various kinds of processing. That is, areas for storing various kinds of data in the process of performing various kinds of processing are appropriately secured in the data memory 103. As such areas, the data memory 103 can be provided with, for example, a centerline generation source data storage unit 1031, a centerline data storage unit 1032, a division information storage unit 1033, a non-correction-target centerline data storage unit 1034, a post-division centerline generation source data storage unit 1035, a post-division centerline data storage unit 1036, a centerline connection state storage unit 1037, a post-correction centerline data storage unit 1038, and a centerline correction data storage unit 1039.

The centerline generation source data storage unit 1031 stores shape information about an indoor space acquired from the centerline generation source data storage device 30. Likewise, the centerline data storage unit 1032 stores a simplified centerline acquired from the centerline data storage device 40. Alternatively, the centerline generation source data storage unit 1031 and the centerline data storage unit 1032 may not be provided, and instead, the processor 101 may acquire shape information or centerline data as needed from the centerline generation source data storage device 30 or the centerline data storage device 40. However, to increase processing speed, it is preferable to store the shape information or the centerline data in the data memory 103 that can be directly accessed by the processor 101.

Figure 3:
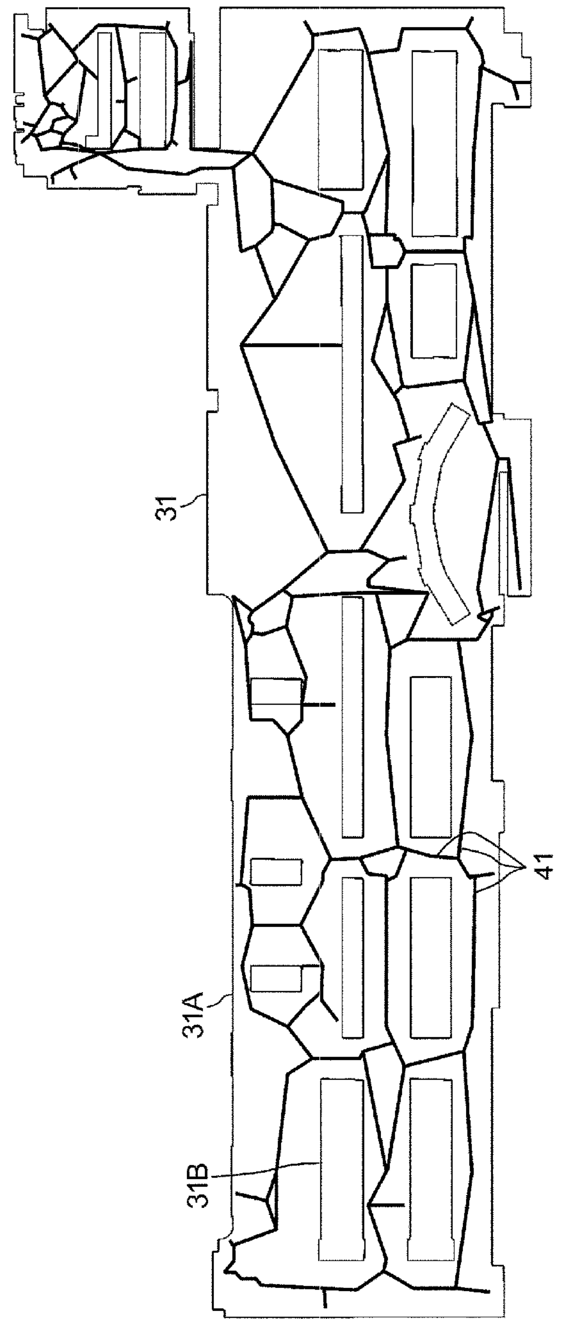
FIG. 3 is a schematic diagram illustrating an example of a relationship between shape information and a centerline before centerline simplification.
Figure 4:
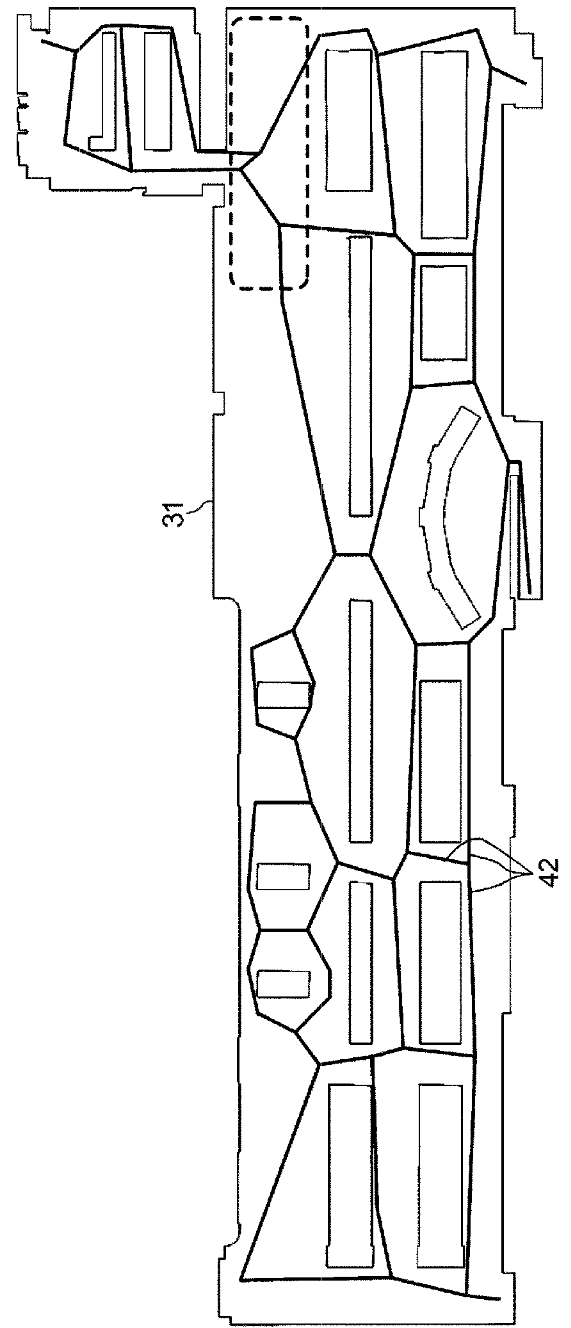
FIG. 4 is a schematic diagram illustrating an example of a relationship between shape information and a centerline after centerline simplification.

FIG. 3 is a schematic diagram illustrating an example of a relationship between a FIG. 31 represented by shape information and a centerline 41 before centerline simplification is performed. The FIG. 31 has an outer frame 31A and an inner frame 31B, and the centerline 41 exists between the outer frame 31A and the inner frame 31B. The centerline generation source data storage device 30 and the centerline generation source data storage unit 1031 store such shape information. FIG. 4 is a schematic diagram illustrating an example of a relationship between the FIG. 31 represented by the shape information and a centerline 42 after the centerline simplification has been performed. The centerline data storage device 40 and the centerline data storage unit 1032 store data of the centerline 42 that has been simplified and corrected.

The division information storage unit 1033 stores a reference line that is the longest straight line of each group extracted by the function of the straight line extraction unit 11. The non-correction-target centerline data storage unit 1034 stores a centerline that is not included in any region of a group.

The post-division centerline generation source data storage unit 1035 stores a figure obtained by rotating an original figure of each group by the function of the centerline correction unit 13. Similarly, the post-division centerline data storage unit 1036 stores a centerline of a figure obtained by rotating an original figure of each group. The centerline connection state storage unit 1037 stores information indicating a connection state between centerlines. The post-correction centerline data storage unit 1038 stores a result of removing unnecessary centerlines.

The centerline correction data storage unit 1039 stores centerline correction data which is a result of the centerline correction by the function of the centerline correction unit 13.

While not particularly illustrated, as with the centerline correction apparatus 10, the network data generation apparatus 20 has a hardware configuration including a processor, a program memory, a data memory, a communication interface, an input/output interface, a bus, an input unit, and a display unit.

The centerline correction apparatus 10 and the network data generation apparatus 20 may share one hardware configuration. That is, a single computer may function as the centerline correction apparatus 10 or as the network data generation apparatus 20 by causing the processor 101 to read and execute the program stored in the program memory 102.

Operation Next, an operation of the centerline correction apparatus 10 will be described.

When the centerline is simplified by thinning out the nodes or the like, a deviation in the position of the centerline may become larger with respect to the outer frame (inner frame) of an original figure. As a result, the shape of the centerline may deviate from the actual center, or the path may become complex. Thus, the centerline correction apparatus 10 eliminates the deviation of the centerline that occurs due to the characteristics of the processing for simplifying the centerline and corrects the position of the centerline to an appropriate position.

However, this centerline is a shape used for searching a path. Therefore, if the centerline breaks or intersects with a wall (the outer frame or inner frame of the shape) due to the correction processing by the centerline correction apparatus 10, the centerline will be meaningless. Thus, consideration needs to be taken.

The centerline correction apparatus 10 according to the present embodiment eliminates a deviation of the centerline and corrects the position of the centerline to an appropriate position without breaking the premise that the centerline does not intersect the outer frame and the inner frame of the input shape of the indoor space, can be formed by connecting straight lines from any internal position of the shape, and can maintain an unbroken state.

Figure 5:
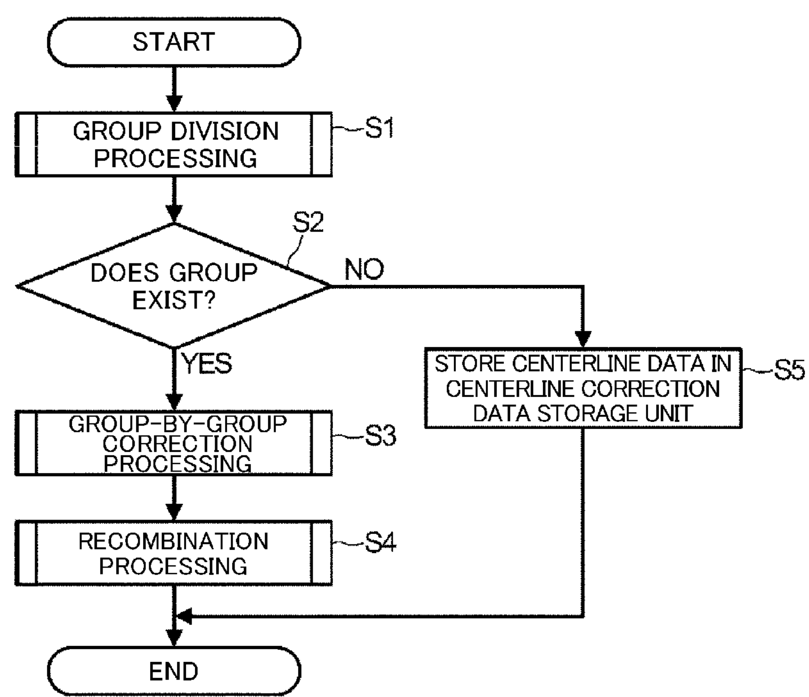
FIG. 5 is a flowchart illustrating an example of a processing operation of the centerline correction apparatus.

FIG. 5 is a flowchart illustrating an example of a processing operation of the centerline correction apparatus 10. In this example, it is assumed that the centerline generation source data storage unit 1031 already stores the shape information about the indoor space and the centerline data storage device 40 already stores data of the centerline 42 on which the simplification correction has been performed.

Drawings such as blueprints typically illustrate an original figure of a centerline in parallel to the X-axis or the Y-axis. However, depending on the shape of a building, there are regions that are not parallel to the X-axis or the Y-axis. Thus, first, before the actual centerline correction is performed, the processor 101 of the centerline correction apparatus 10 performs group division processing so as to make the original figure of a centerline parallel to the X-axis or the Y-axis (step S1). The details of this group division processing will be described below.

Next, the processor 101 determines whether a group exists as a result of the group division processing (step S2). If there is a group, the processor 101 performs group-by-group correction processing for correcting the centerline on a group basis (step S3). Next, the processor 101 performs recombination processing for combining the group-by-group correction results (step S4). The details of the group-by-group correction processing and the recombination processing will also be described below.

In contrast, if the processor 101 determines that no group exists in step S2 described above, the processor 101 stores the simplified centerline data stored in the centerline data storage unit 1032 in the centerline correction data storage unit 1039 (step S5). That is, if there is no group, since the centerline correction apparatus 10 cannot perform the centerline correction, the centerline correction apparatus 10 provides the network data generation apparatus 20 with the simplified centerline data without making any correction.

Figure 6:
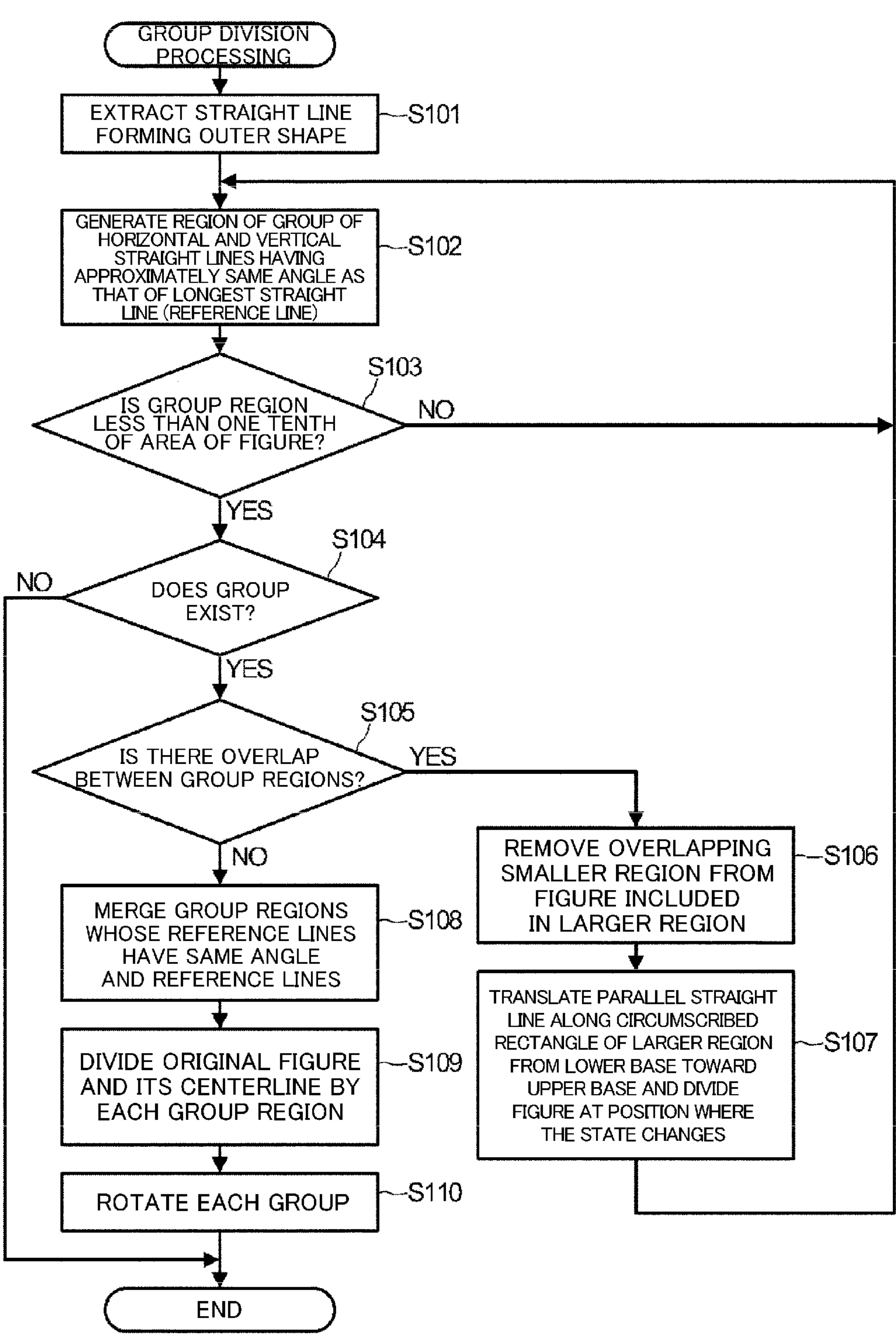
FIG. 6 is a flowchart illustrating an example of details of group division processing in FIG. 5.

FIG. 6 is a flowchart illustrating an example of the details of the group division processing in step S1 described above. The present group division processing is processing for dividing "an original figure of a centerline and the centerline generated from the original figure so that the original figure of the centerline is parallel to the X-axis or the Y-axis".

First, the processor 101 divides the outer frame shape of the original figure from which the centerline is generated at each vertex based on the shape information stored in the centerline generation source data storage unit 1031 and extracts only straight lines in order of length (step S101). In this way, the processor 101 functions as the straight line extraction unit 11.

Next, the processor 101 finds and groups the straight lines not yet included in a group and having approximately the same angle as that of the longest straight line (including the straight line that intersects at a right angle) from the extracted straight lines and generates a region that includes all the vertices of the grouped straight lines (step S102). The above angle ±1° is set as a default, and the user is allowed to adjust the angle to any value.

Figure 7A:
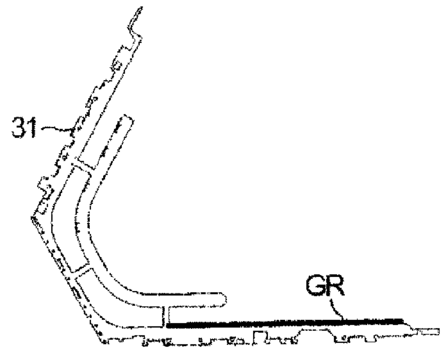
FIG. 7A is a diagram for describing a reference line of a group.
Figure 7B:
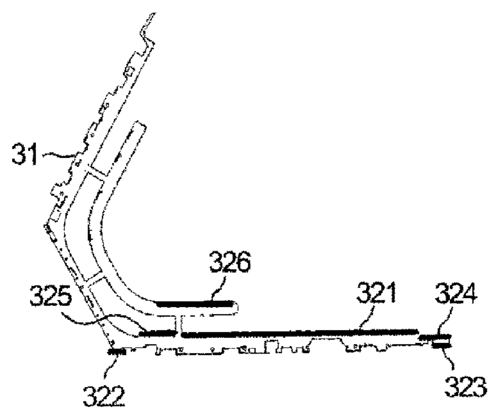
FIG. 7B is a diagram for describing a straight line having the same angle as that of the reference line.
Figure 7C:
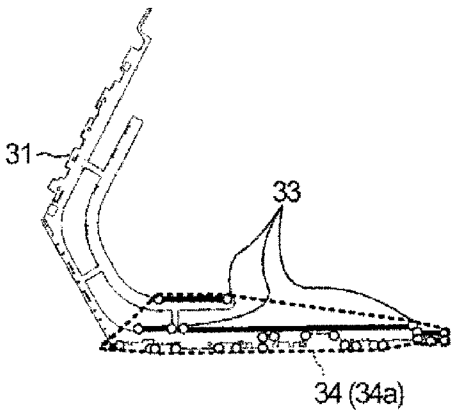
FIG. 7C is a diagram for describing a region of a group.

As an example of a region generation method, a region can be generated by randomly selecting three vertices from all the vertices of the respective straight lines to generate a triangle and repeating merging the generated triangles. Efficiency can be improved by excluding the vertices inside the triangle. Here, as illustrated in FIG. 7A, the processor 101 stores the longest straight line in the division information storage unit 1033 as a reference line GR of the group. Next, as illustrated in FIG. 7B, the processor 101 groups straight lines (including a straight line that intersects at a right angle) 322, 323, 324, 325, and 326 with the same angle as that of a straight line 321, which is a reference line GR. Next, as illustrated in FIG. 7C, the processor 101 generates a region 34 (34*a* in FIG. 7C) that includes all the vertices 33 of the straight lines in the same group.

Figure 7D:
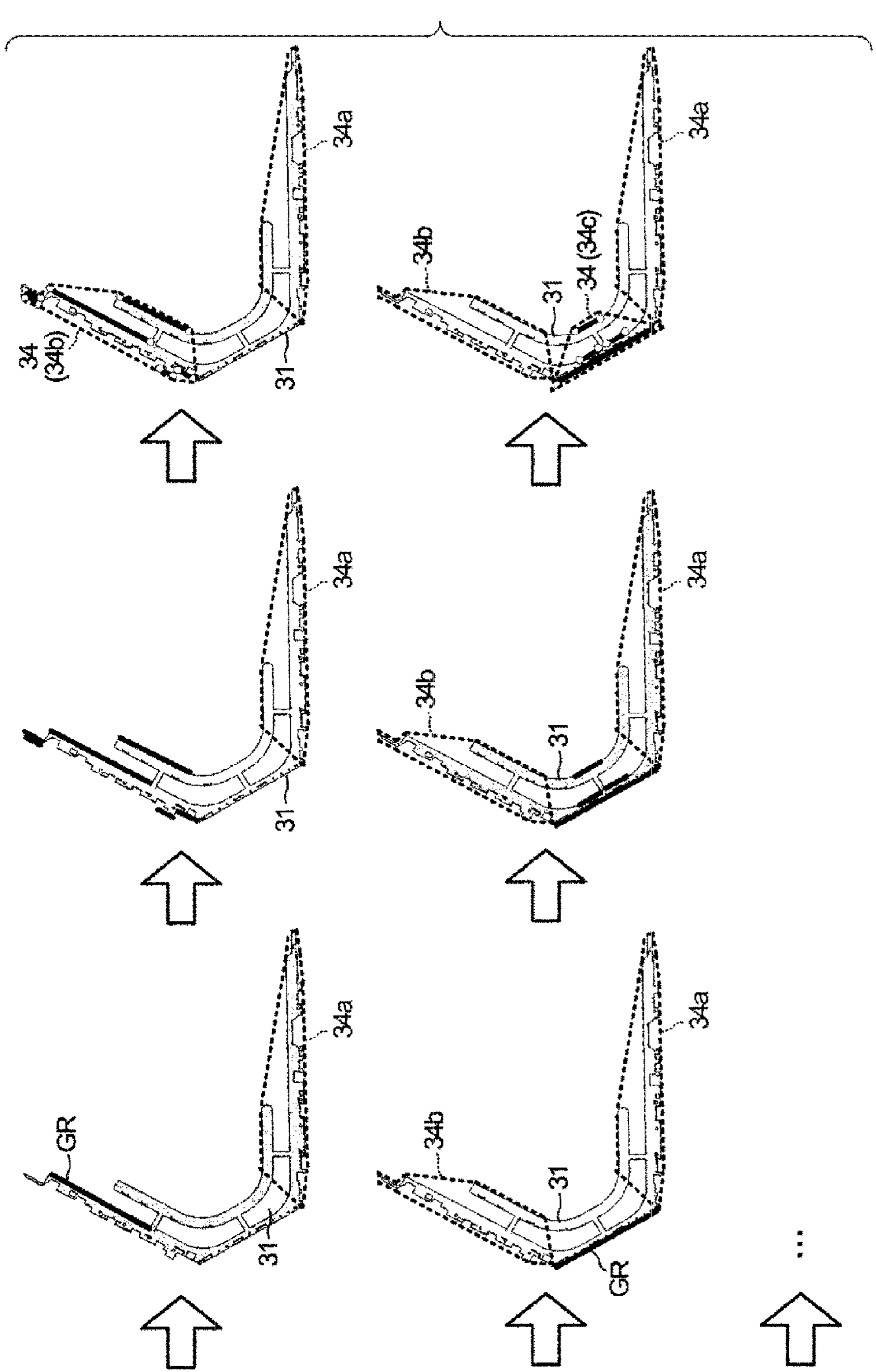
FIG. 7D is a diagram for describing generation of regions of groups for the other straight lines.

Next, the processor 101 determines whether the region generated in step S102 described above is less than one tenth of the area of the original figure (step S103). This determination criterion, which is one tenth of the area, is a default, and the user is allowed to adjust the determination criterion to any value. If the processor 101 determines that the generated region has a size equal to or larger than one tenth of the original figure, the processor 101 returns to the processing in step S102 described above. In this way, by repeating the processing loop of steps S102 and S103 on the remaining straight lines, as illustrated in FIG. 7D, more regions 34, such as regions 34*b*, 34*c*, . . . , are generated.

Further, in step S102 described above, when the processor 101 determines that the generated region has a size less than one tenth of the original figure, since no effect can be obtained even if the centerline correction is performed on the centerline in this range, the processor 101 excludes such a range from the target and exits the processing loop of step S102 and step S103.

Next, the processor 101 determines whether the group exists, that is, whether or not a group has been generated (step S104). If the processor 101 determines that no group exists, the processor 101 ends this group division processing.

In contrast, if the processor 101 determines that the group exists, the processor 101 determines whether there is an overlap in regions between the groups (step S105). If the processor 101 determines that there is an overlap, first, the processor 101 removes the region of the smaller group from the figure included in the region of the larger group in the overlapping groups (step S106).

Next, the processor 101 generates a circumscribed rectangle for the figure (for each figure, in a case where there is a plurality of figures) of the region of the larger group obtained as a result of the removal. Next, the processor 101 translates the straight line parallel to the X-axis along the circumscribed rectangle in the range of the circumscribed rectangle from the lower base (the smallest Y coordinate) toward the upper base of the circumscribed rectangle and divides the original figure at the Y coordinate where the state changes significantly (step S107).

The outer frame of an existing building commonly has slight irregularities along the wall. Performing division on all these irregularities leads to excess division. Therefore, the change in the division surface is found as described below.

(1) A straight line parallel to the X-axis is a candidate for division since a change in the figure occurs at such a portion.

(2) The figure is divided in ascending order of the Y-coordinate of a straight line parallel to the X-axis.

(3) Of the straight lines parallel to the X-axis, the followings are excluded.

(3A) Both ends of the straight line are in contact with straight lines at right angles (the same group).

(3B) When the area of a figure obtained as a result of dividing the figure at the parallel line is less than one tenth of the area of the original figure, such parallel line is excluded from the division target since no effect can be obtained even if the centerline correction is performed on the centerline in such a range. This determination criterion, which is one tenth, is a default, and the use is allowed to adjust the determination criterion to any value.

Figure 8A:
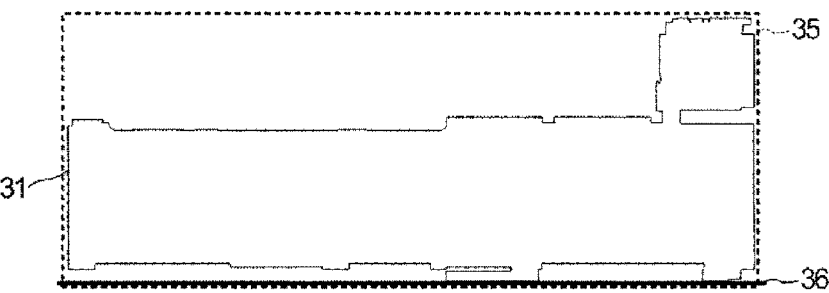
FIG. 8A is a diagram illustrating an example of a case where a figure is not divided.

For example, in an example illustrated in FIG. 8A, in a circumscribed rectangle 35 of a group region, since a straight line 36 does not satisfy the above (3A), a FIG. 31 is not divided by the straight line 36.

Figure 8B:
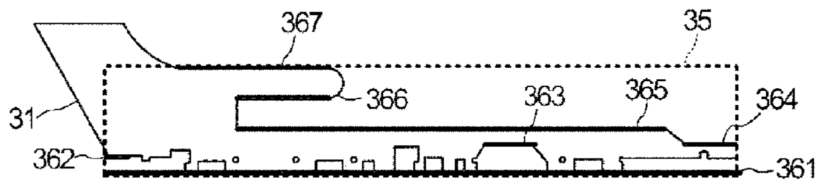
FIG. 8B is a diagram illustrating an example in which a figure is divided by one straight line among a plurality of straight lines.

In an example illustrated in FIG. 8B, in a circumscribed rectangle 35 of a group region, a straight line 365 is the only straight line that satisfies the above (3A) and (3B) among straight lines 361 to 367.

Figure 8C:
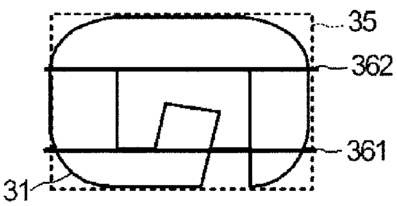
FIG. 8C is a diagram illustrating an example of a straight line that divides a figure.
Figure 8D:
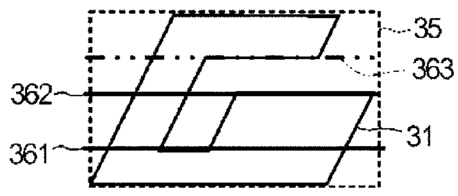
FIG. 8D is a diagram illustrating an example of a straight line that divides a figure and a straight line that does not divide a figure.

FIGS. 8C and 8D illustrate examples of the division. In the example illustrated in FIG. 8C, in a circumscribed rectangle 35 of a group region, an original FIG. 31 is divided at positions of straight lines 361 and 362 at each of which a significant change occurs and which satisfy the above (3A) and (3B). In the example illustrated in FIG. 8D, in a circumscribed rectangle 35 of a group region, an original FIG. 31 is divided at positions of straight lines 361 and 362. A straight line 363 indicated by a two-dot chain line in FIG. 8D is excluded from the candidates since the above (3-B) cannot be satisfied if the division is performed at the straight line 363.

Next, the processor 101 returns to the processing in step S102 described above. In this way, a group region is generated for each divided figure with the straight lines excluding the straight line portion of the divided surface.

When there are no more group regions overlapping with each other, in step S105 described above, the processor 101 determines that there is no overlapping between the group regions. When this determination has been made, the processor 101 merges the group regions whose reference lines have the same angle as well as the reference lines of the corresponding groups and the reference line of such a group (step S108). This determines the region of the group. In this way, the processor 101 functions as the region generation unit 12.

Figure 9A:
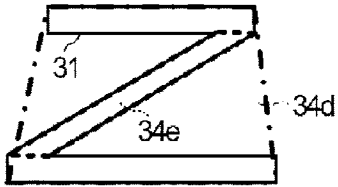
FIG. 9A is a diagram illustrating an example in a case where group regions overlap with each other.
Figure 9B:
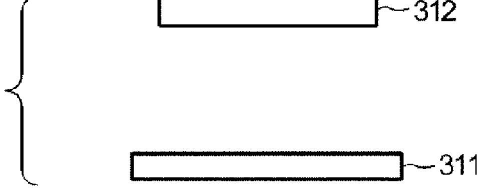
FIG. 9B is a diagram illustrating a state in which a smaller region is removed in the example in FIG. 9A.
Figure 9C:
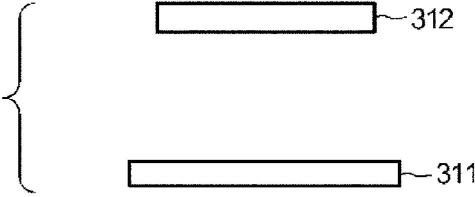
FIG. 9C is a diagram illustrating a portion where a significant change occurs in the example in FIG. 9A.
Figure 9D:
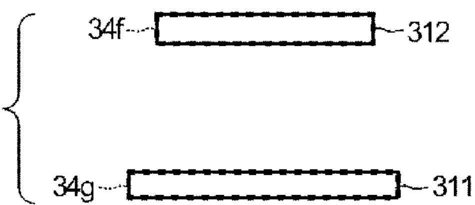
FIG. 9D is a diagram illustrating group regions generated for divided figures in the example in FIG. 9A.
Figure 9E:
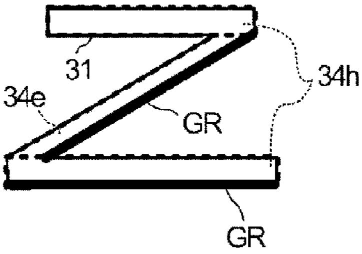
FIG. 9E is a diagram illustrating merged group regions in the example in FIG. 9A.

For example, as illustrated in FIG. 9A, assuming that a group region 34*d* indicated by a dot-and-dash line and a group region 34*e* indicated by a dashed line are generated for a FIG. 31 indicated by the shape information, these two regions overlap with each other. In this case, when the region of the smaller group is removed from the figure included in the region of the larger group by performing the processing in step S106, two FIGS. 311 and 312 remain as illustrated in FIG. 9B. The processing in step S107 is performed on these remaining FIGS. 311 and 312. In each case of the FIGS. 311 and 312 illustrated in FIG. 9B, even when a straight line parallel to the X-axis is translated along the circumscribed rectangle, the state does not change significantly. Therefore, the figures are not divided as illustrated in FIG. 9C. Thus, the processing in step S102 is subsequently performed on each of the FIGS. 311 and 312, and group regions 34*f* and 34*g* are generated as illustrated in FIG. 9D. Next, in step S108, the group regions 34*f* and 34*g* having the same angle are merged, and further, the reference lines GR of the respective regions are merged. As a result, as illustrated in FIG. 9E, group regions 34*e* and 34*h* are determined for the FIG. 31.

Figure 10A:
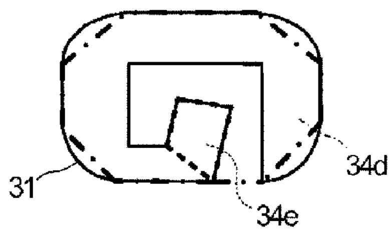
FIG. 10A is a diagram illustrating an example in a case where group regions overlap with each other.
Figure 10B:
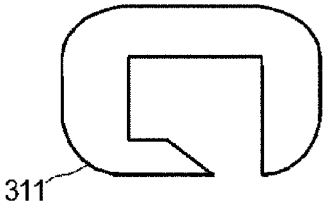
FIG. 10B is a diagram illustrating a state in which a smaller region is removed in the example in FIG. 10A.
Figure 10C:
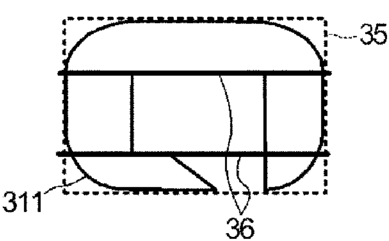
FIG. 10C is a diagram illustrating a portion where a significant change occurs in the example in FIG. 10A.
Figure 10D:
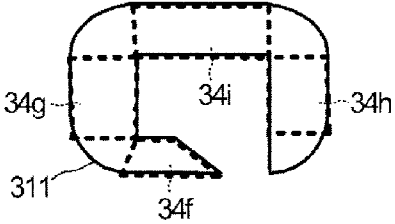
FIG. 10D is a diagram illustrating group regions generated for divided figures in the example in FIG. 10A.
Figure 10E:
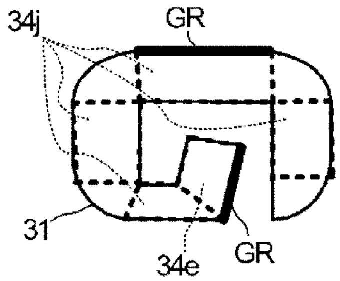
FIG. 10E is a diagram illustrating merged group regions in the example in FIG. 10A.

In addition, for example, as illustrated in FIG. 10A, assuming that a group region 34*d* indicated by a dot-and-dash line and a group region 34*e* indicated by a dashed line are generated for a FIG. 31 indicated by the shape information, these two regions overlap with each other. In this case, when the region of the smaller group is removed from the figure included in the region of the larger group by performing the processing in step S106, a FIG. 311 remains as illustrated in FIG. 10B. When the processing in step S107 is performed on this remaining FIG. 311, as illustrated in FIG. 10C, the FIG. 311 is divided at positions of straight lines 36 where significant changes occur. Thus, the processing in step S102 is subsequently performed on each of these divided figures, and group regions 34*f*, 34*g*, 34*h*, and 34*i* are generated as illustrated in 10D. Next in step S108, the group regions 34*f*, 34*g*, 34*h*, and 34*i* having the same angle are merged, and further, the reference lines GR of the respective regions are merged. As a result, as illustrated in FIG. 10E, group regions 34*e* and 34*j* are determined for the FIG. 31.

Figure 11A:
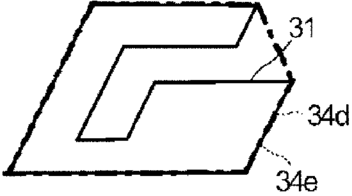
FIG. 11A is a diagram illustrating an example in a case where group regions overlap with each other.
Figure 11B:
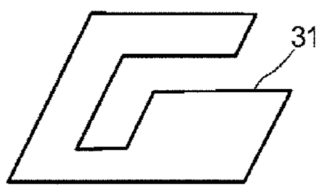
FIG. 11B is a diagram illustrating a state in which a smaller region is removed in the example in FIG. 11A.
Figure 11C:
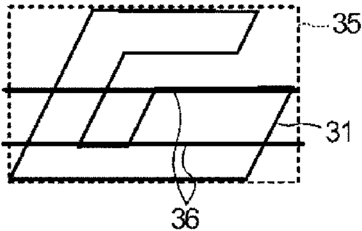
FIG. 11C is a diagram illustrating a portion where a significant change occurs in the example in FIG. 11A.
Figure 11D:
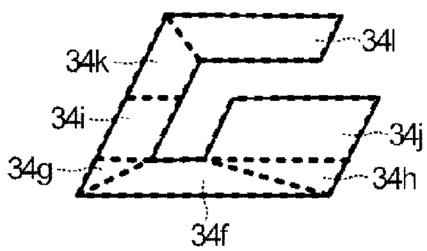
FIG. 11D is a diagram illustrating group regions generated for divided figures in the example in FIG. 11A.
Figure 11E:
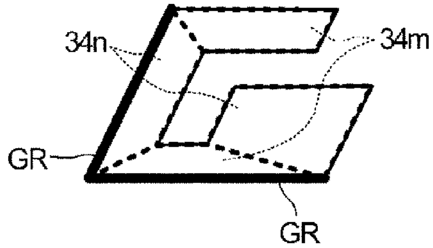
FIG. 11E is a diagram illustrating merged group regions in the example in FIG. 11A.

Further, as illustrated in FIG. 11A, assuming that a group region 34*d* indicated by a dot-and-dash line and a group region 34*e* indicated by a dashed line are generated for a FIG. 31 indicated by the shape information, these two regions overlap with each other. In this case, the region of the smaller group is removed from the figure included in the region of the larger group by performing the processing in step S106. However, in this example, there is no difference in size of the regions, that is, the regions have the same size. Thus, the FIG. 31 remains as it is as illustrated in FIG. 11B. When the processing in step S107 is performed on this FIG. 31, as illustrated in FIG. 11C, the FIG. 31 is divided at positions of straight lines 36 where significant changes occur. Thus, the processing in step S102 is subsequently performed on each of these divided figures, and group regions 34*f*, 34*g*, 34*h*, 34*i*, 34*j*, 34*k*, and 34*l* are generated as illustrated in 11D. Next in step S108, the group regions 34*f* and 34*l* having the same angle are merged, and likewise, the group regions 34*g*, 34*h*, 34*i*, 34*j*, and 34*k* having the same angle are merged. Further, the reference lines GR of the respective regions are merged. As a result, as illustrated in FIG. 11E, group regions 34*m* and 34*n* are determined for the FIG. 31.

Figure 12:
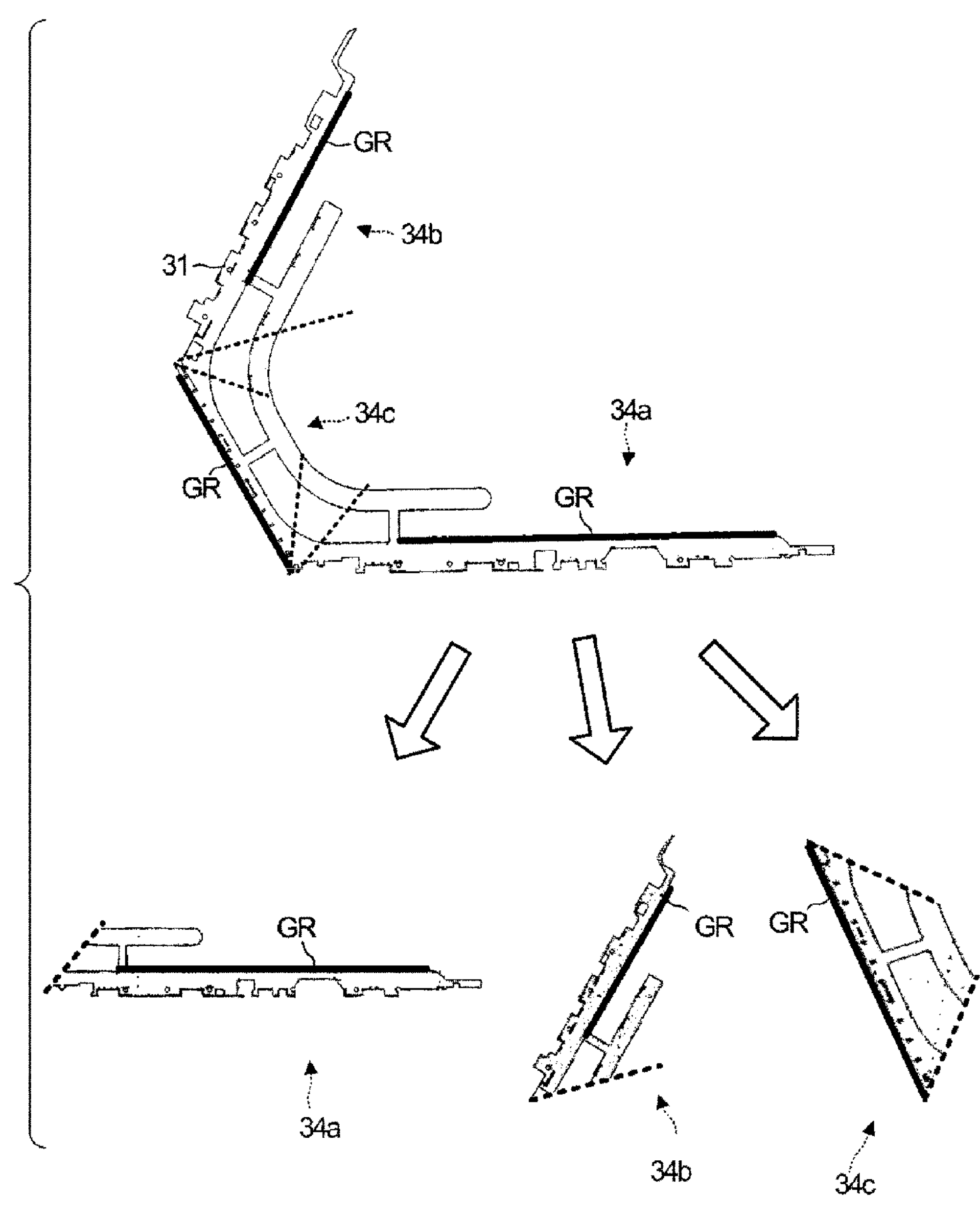
FIG. 12 is a diagram for describing division of an original figure and centerline thereof by each group region.

After the group regions have thus been generated, the processor 101 divides the original figure and the centerline thereof by each group region (step S109). For example, as illustrated in FIG. 12, the respective figures of the group regions 34*a*, 34*b*, and 34*c* and the respective centerlines thereof are divided from the original FIG. 31. Here, the processor 101 stores the centerline not included in any of the group regions in the non-correction-target centerline data storage unit 1034.

Figure 13:
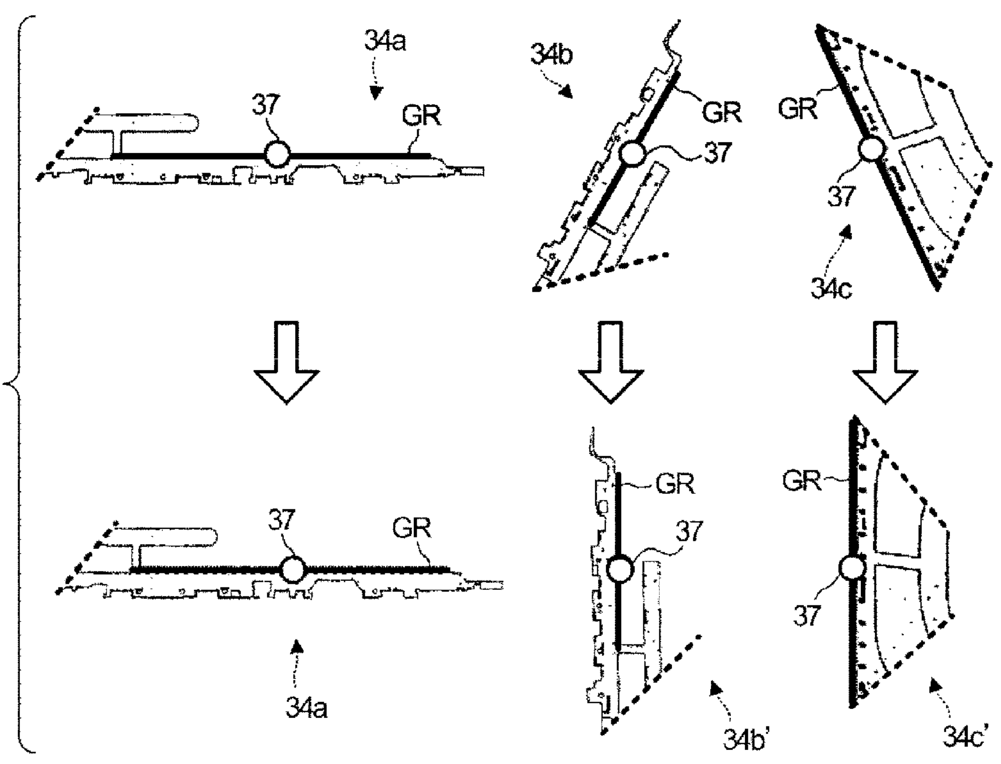
FIG. 13 is a diagram for describing rotation of a region of each group.

Next, as illustrated in FIG. 13, the processor 101 rotates the original figure of each of the divided group regions 34*a*, 34*b*, and 34*c* and the centerline thereof around a center point 37 of the reference line GR of each group in accordance with the angle of the reference line GR, that is, when the angle is −45° to 45°, the original figure and the centerline thereof are rotated to be parallel to the X-axis, when other than the above angle, to be parallel to the Y-axis (step S110). As a result, in the example in FIG. 13, the original figures of the group regions 34*b* and 34*c* and the centerlines thereof are rotated to be original figures of group regions 34*b*' and 34*c*' and the centerlines thereof. This rotation angle is stored in the division information storage unit 1033 per group. Further, the processor 101 stores the rotated figure and the center point of the rotation in the post-division centerline generation source data storage unit 1035 and also stores the centerline of the rotated figure in the post-division centerline data storage unit 1036.

Figure 14:
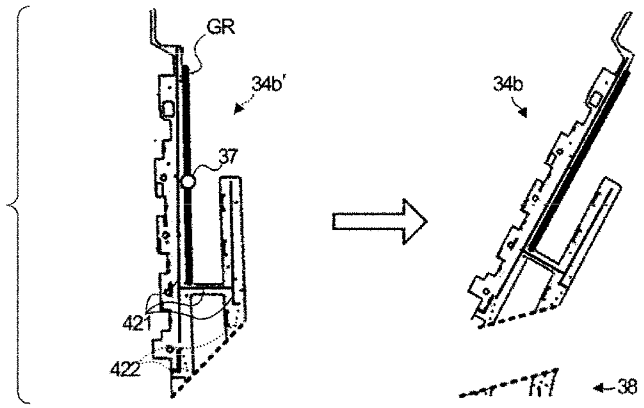
FIG. 14 is a diagram for describing handling of a split centerline.

In addition, the centerline correction is subsequently performed in the group-by-group correction processing in step S3, and as illustrated in FIG. 14, the centerline in an out-of-group region 38, which has not been recognized as a group, needs to be reconnected eventually by rotating in the reverse direction in the recombination processing in step S4. Therefore, the centerline split by this group division processing is stored in the division information storage unit 1033 to be excluded from the correction candidates in step S3. In FIG. 14, for clarity, unsplit centerlines 421 are indicated by solid lines, and split centerlines 422 are indicated by dashed lines.

The processor 101 thus ends the group division processing in step S1.

Figure 15:
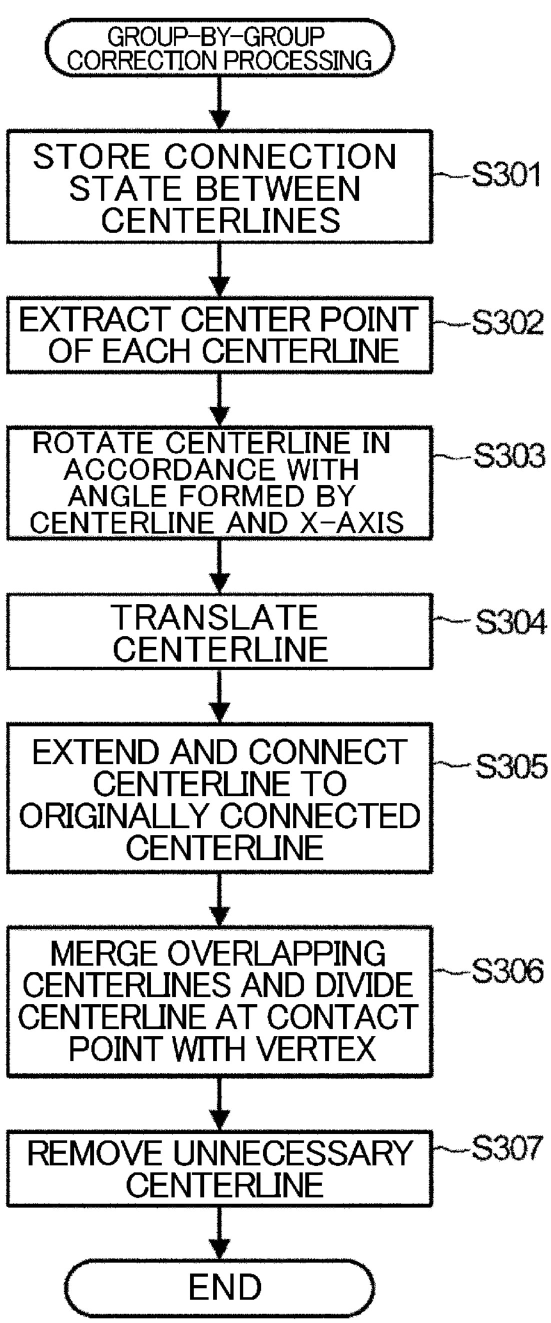
FIG. 15 is a flowchart illustrating an example of details of group-by-group correction processing in FIG. 5.

FIG. 15 is a flowchart illustrating an example of the details of the group-by-group correction processing in step S3 described above. In this group-by-group correction processing, the processor 101 performs correction of a centerline by using a pair of an original figure of the centerline, the outer frame of which is parallel to the X-axis or the Y-axis, and the centerline, which is generated from the figure, as input.

First, the processor 101 assigns an identifier (hereinafter, referred to as an ID) to the individual centerline of the rotated figure per group stored in the post-division centerline data storage unit 1036 and stores a connection state in the centerline connection state storage unit 1037 by using the ID (step S301). This is performed to maintain the connection state between the centerlines before the correction, for the purpose of avoiding the interruption between the centerlines due to the centerline correction. Since the centerline split by the division in step S1 is not subject to the subsequent correction processing, the processor 101 acquires the information about such a split centerline from the division information storage unit 1033 and excludes the acquired centerline from the ID assignment targets.

Figure 16:
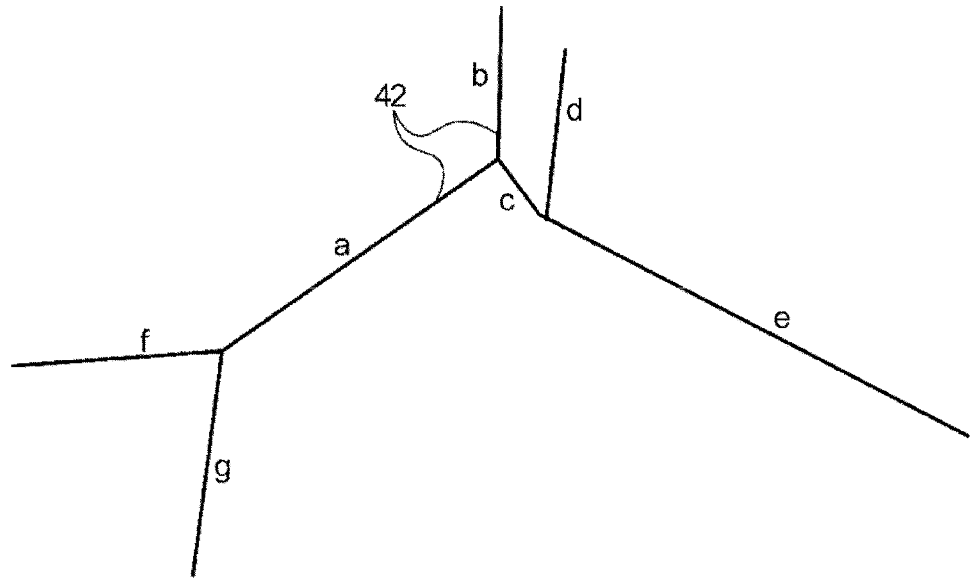
FIG. 16 is a schematic diagram for describing an example of processing for assigning an identifier to a centerline.

FIG. 16 is a diagram illustrating an example of this ID assignment. This diagram corresponds to a portion surrounded by the dashed line in FIG. 4. The same portion will also be used in the following description. In the example in FIG. 16, the processor 101 assigns IDs a to g to individual centerlines 42 acquired from the post-division centerline data storage unit 1036. Further, the processor 101 stores connection states between the centerlines (a-b, b-c, a-c, c-d, d-e, c-e, f-a, g-a, f-g) in the centerline connection state storage unit 1037 by using the IDs.

Figure 17:
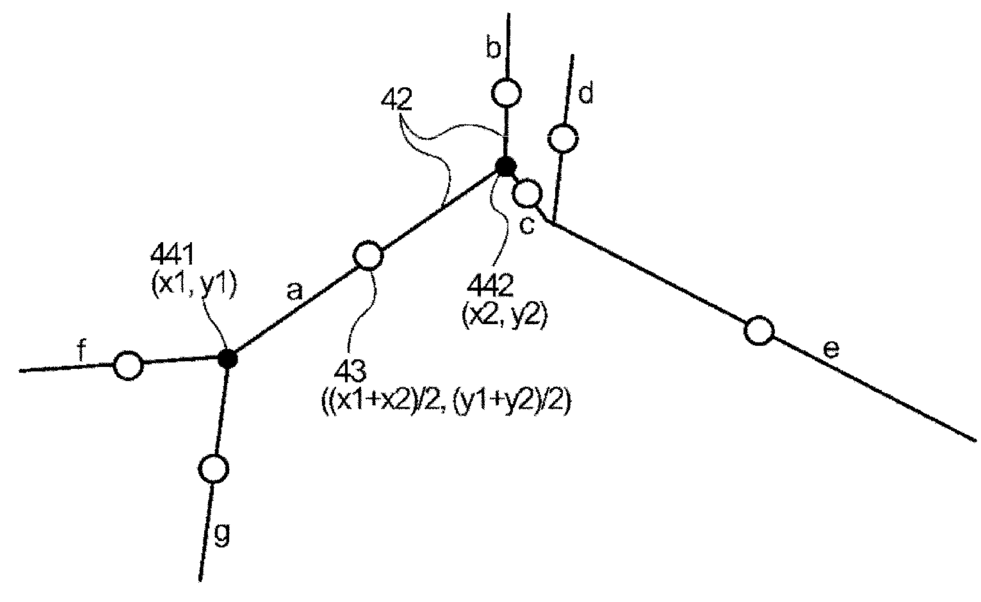
FIG. 17 is a schematic diagram for describing an example of processing for extracting a center point of a centerline.

Next, the processor 101 extracts a center point 43 of each centerline 42 (step S302). For example, as illustrated in FIG. 17, a coordinate of the center point 43 of the centerline 42 with ID=a is ((x1+x2)/2, (y1+y2)/2), derived from the coordinates (x1, y1) and (y2, y2) of vertices 441 and 442 of the centerline 42 of a.

Figure 18:
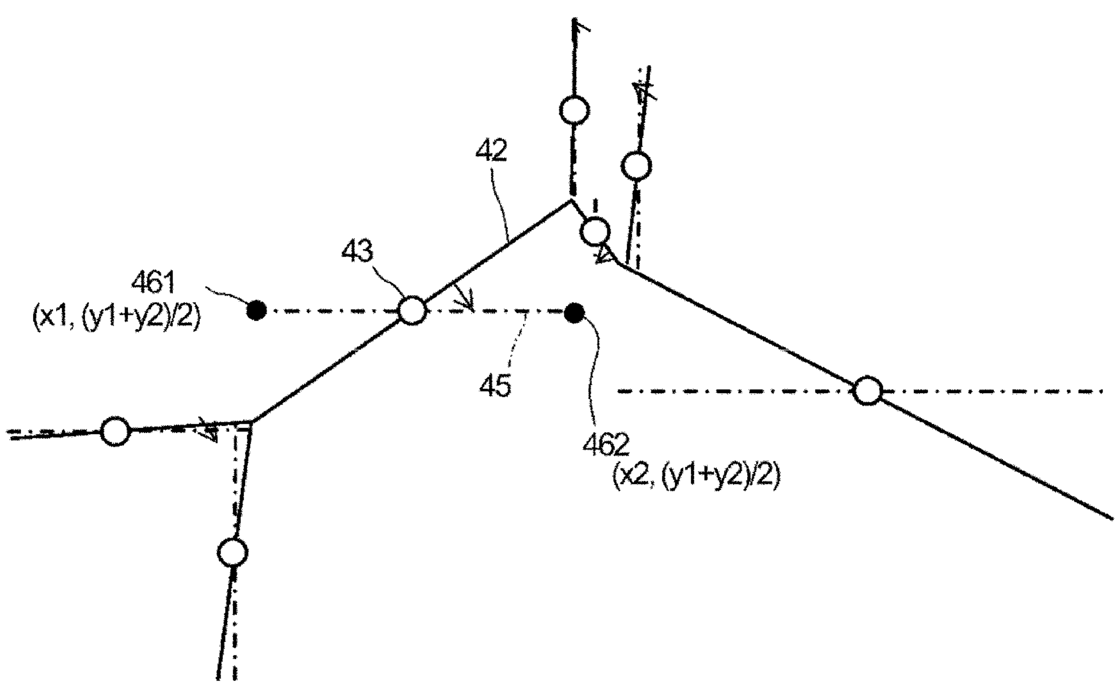
FIG. 18 is a schematic diagram for describing an example of centerline rotation processing.

Next, the processor 101 rotates the centerline in accordance with the angle formed by the centerline and the X-axis (step S303). For example, as illustrated in FIG. 18, since the angle formed by the centerline 42 with ID=a and the X-axis is within a range of 0° to 45°, the processor 101 rotates the centerline 42 around the center point 43 extracted in step S302 so that the centerline 42 becomes parallel to the X-axis. In this operation, in view of the calculation cost and the consistency in the reconnection processing performed after the subsequent rotation processing, the length of the original centerline 42 is not maintained. In this case, the centerline 42 is rotated by aligning the Y coordinates of the vertices 441 and 442 with the Y coordinate of the center point 43. In a case of the centerline 42 with ID=a in the example in FIG. 18, the coordinate (x1, y1) of the vertex 441 before the rotation becomes a coordinate (x1, (y1+y2)/2) of a vertex 461 of a centerline 45 after the rotation, and the coordinate (x2, y2) of the vertex 442 before the rotation becomes a coordinate (x2, (y1+y2)/2) of a vertex 462 of the centerline 45 after the rotation. In FIG. 18, for easy distinction, the centerline 42 before the rotation is indicated by a solid line, and the centerline 45 after the rotation is indicated by a dot-and-dash line.

In the case where the centerline 42 is rotated to be parallel to the X-axis, as described above, the angle formed by the centerline 42 and the X-axis is within a range of −45° to 45°, and in a case where the centerline 42 is rotated to be parallel to the Y-axis, the angle formed by the centerline 42 and the X-axis is outside the above range. Further, in the case where the centerline 42 is rotated to be parallel to the X-axis, as described above, the centerline 42 is rotated by aligning the Y coordinates of the respective vertices 461 and 462 after the rotation with the Y coordinate of the center point 43, and in the case where the centerline 42 is rotated to be parallel to the Y coordinate, as described above, the centerline 42 is rotated by aligning the X coordinates of the respective vertices 461 and 462 with the X coordinate of the center point 43.

Figure 19:
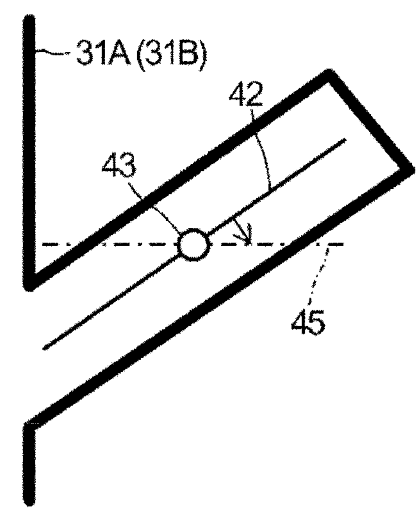
FIG. 19 is a schematic diagram for describing a centerline excluded from the rotation processing.

Basically, the rotation processing is performed as described above. As an exception, however, as illustrated in FIG. 19, in a case where the centerline 42 intersects an outer frame 31A or an inner frame 31B of the original figure as a result of the rotation, the centerline 42 is maintained as it is without being rotated. To make this determination, the processor 101 refers to the shape of the rotated original figure stored in the post-division centerline generation source data storage unit 1035.

Figure 20:
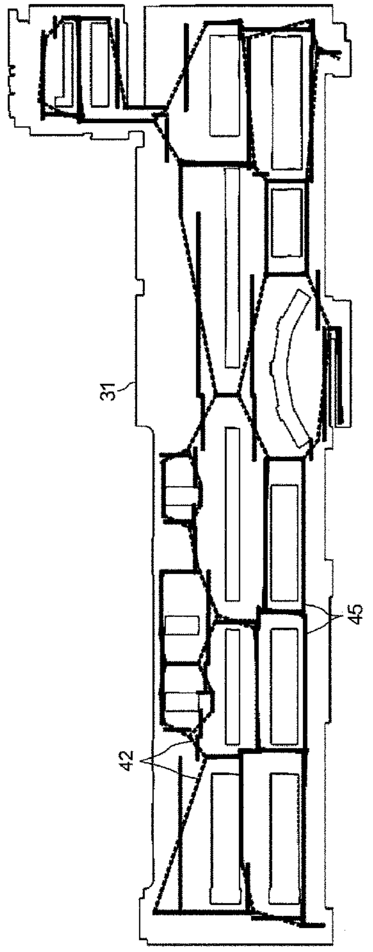
FIG. 20 is a schematic diagram illustrating an example of a result of the centerline rotation processing.

FIG. 20 is a diagram illustrating a result of the rotation processing performed on the centerline. In FIG. 20, the centerline 42 before the rotation is indicated by a dashed line (*the official drawing will be corrected accordingly), and the centerline 45 after the rotation is indicated by a solid line.

Next, to rearrange the centerline 45 to be at the center of the path, the processor 101 translates the centerline 45 by using the shape of the rotated original figure stored in the post-division centerline generation source data storage unit 1035 (step S304). Specifically, the processor 101 translates the centerline 45 rotated in step S303 described above along the axis in parallel in both positive and negative directions until the centerline 45 collides with the outer frame 31A or the inner frame 31B of the original figure, sums the respective distances to these frames, and translates the centerline 45 to the position to be the center. If the centerline 45 falls outside the range of the circumscribed rectangle including the other originally connected centerline as a result of the translation, the translation is performed in accordance with condition (1) or (2) below.

(1) If a centerline of the same type (horizontal or vertical) is included in the originally connected centerlines, the centerline 45 is translated to the same position as the centerline.

(2) If a centerline of the same type (horizontal or vertical) is not included, the translation is not performed.

Figure 21:
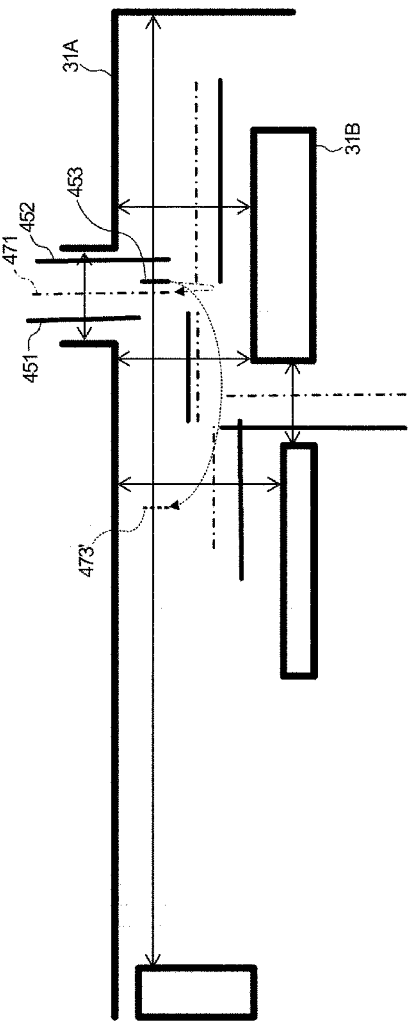
FIG. 21 is a schematic diagram for describing an example of centerline translation processing.

For example, as illustrated in FIG. 21, the processor 101 translates a centerline 451 in both positive and negative directions until the centerline 451 collides with the outer frame 31A or the inner frame 31B of the original figure, sums the respective distances to these frames, and translates the centerline 451 to a position 471 to be the center. Likewise, a centerline 452 is translated to the position 471 to which the centerline 451 has been moved. In contrast, if the processor 101 translates a centerline 453 in both positive and negative directions until the centerline 453 collides with the outer frame 31A or the inner frame 31B of the original figure, sums the respective distances to these frames, and calculates the position to be the center, the obtained position 473' falls outside the range of the circumscribed rectangle. Thus, in accordance with the above condition (1), the centerline 453 is translated to the position 471, which is the same position as the centerlines 451 and 452.

Figure 22:
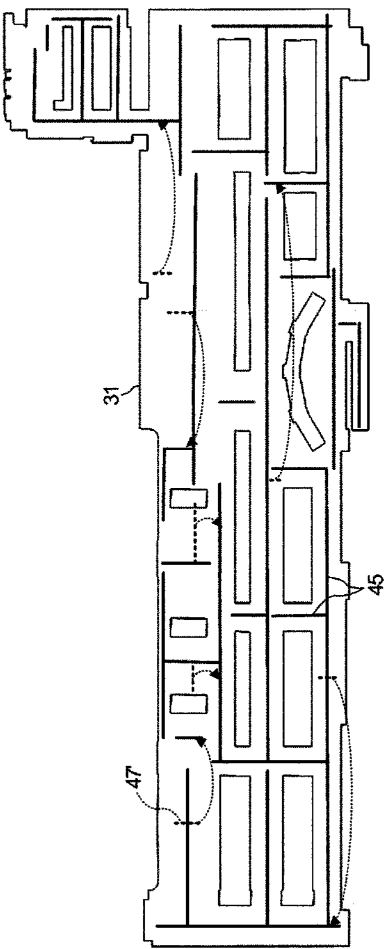
FIG. 22 is a schematic diagram illustrating an example of a result of the centerline translation processing.

FIG. 22 is a diagram illustrating a result of this centerline translation processing. In FIG. 22, the translated centerline 45 is indicated by a thick solid line, and a position 47' to which the centerline 45 has not been translated is indicated by a dashed line.

Next, the processor 101 performs reconnection processing for connecting the centerlines by extending the centerline 45 to the centerline to which the centerline 45 has originally been connected (step S305). That is, the processor 101 receives, from the centerline connection state storage unit 1037, information about the originally connected centerline stored in step S301 and reconnects the centerlines that have been split from each other by the rotation processing in step S303 and the translation processing in step S304.

Figure 23:
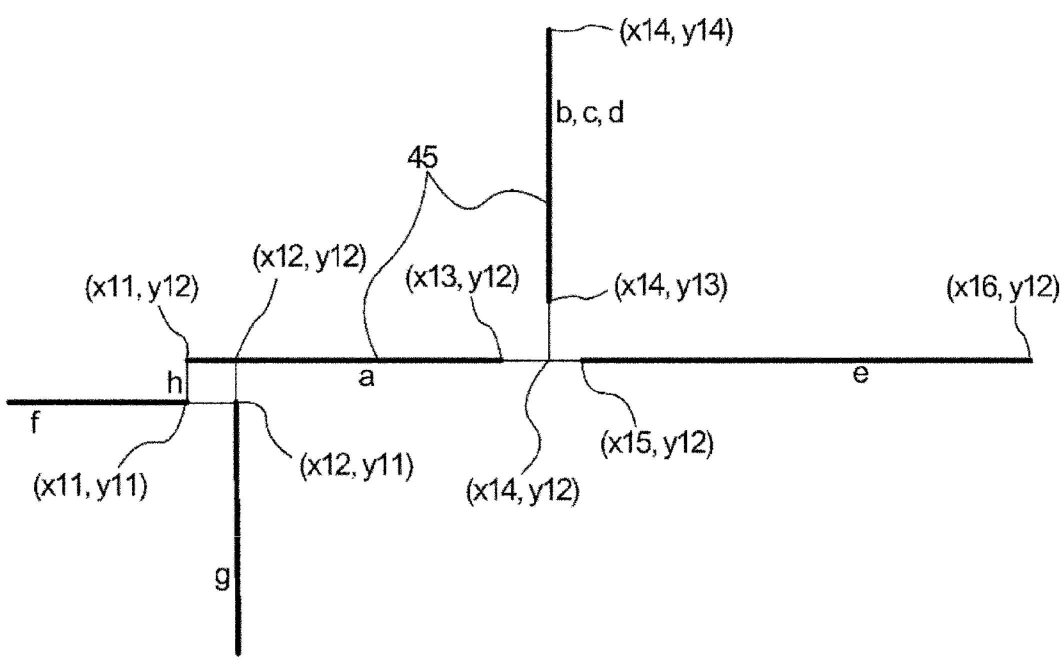
FIG. 23 is a schematic diagram for describing an example of reconnection processing between centerlines.

For example, as illustrated in FIG. 16, before the processing of the centerline 42, the centerline 42 indicated by ID=a has been originally connected to a centerline 42 indicated by ID=b and a centerline 42 indicated by ID=c. After the rotation processing in step S303, since these centerlines are different in type (vertical/horizontal), a rotated centerline 45 indicated by ID=a is disconnected from rotated centerlines 45 indicated by IDs=b and c, as illustrated in FIG. 23. Therefore, in this step S305, the processor 101 extends the X coordinate x13 of the vertex of the rotated centerline 45 indicated by ID=a, which is a horizontal line, to the X coordinate x14 of the rotated centerlines 45 indicated by IDs=b and c, as indicated by a thin solid line in FIG. 23. Likewise, the centerline 42 indicated by ID=b has been connected to the centerline 42 indicated by ID=a, and after the rotation processing in step S303, since these centerlines are different in type (vertical/horizontal), in this step S305, the processor 101 extends the Y coordinate y13 of the vertex of a rotated centerline 45 indicated by ID=b, which is a vertical line, to the Y coordinate y12 of the rotated centerline 45 indicated by ID=a, which is a horizontal line, as indicated by a thin solid line in FIG. 23. Up to this point, (a-b, b-c, a-c, c-d) are reconnected.

Likewise, a centerline 42 indicated by ID=e has been connected to a rotated centerline 42 indicated by ID=d, and after the rotation processing in step S303, since these centerlines are different in type, in this step S305, the processor 101 extends the X coordinate x15 of the vertex of a rotated centerline 45 indicated by ID=e, which is a horizontal line, to the X coordinate x14 of a rotated centerline 45 indicated by ID=d, which is a vertical line, as indicated by a thin solid line in FIG. 23. Up to this point, (a-b, b-c, a-c, c-d, d-e, c-e) are reconnected.

Likewise, a centerline 42 indicated by ID=f has been connected to the centerline 42 indicated by ID=a, and after the rotation processing in step S303, since these centerlines are the same type, in this step S305, the processor 101 creates a centerline 45 indicated by a new ID=h having two vertices, which are the vertex of a rotated centerline 45 indicated by ID=f, which is a horizontal line, and the vertex of the rotated centerline 45 indicated by ID=a, which is also a horizontal line, as indicated by a thin solid line in FIG. 23. Up to this point, (a-b, b-c, a-c, c-d, d-e, c-e, f-a (f-h, h-a)) are reconnected.

Further, the centerline 42 indicated by ID=f has also been connected to a centerline 42 indicated by ID=g, and after the rotation processing in step S303, since these centerlines are different in type, in this step S305, the processor 101 extends the X coordinate x1 of the vertex of the rotated centerline 45 indicated by ID=f, which is a horizontal line, to the X coordinate x12 of a rotated centerline 45 indicated by ID=g, which is a vertical line, as indicated by a thin solid line in FIG. 23. Up to this point, (a-b, b-c, a-c, c-d, d-e, c-e, f-a (f-h, h-a), f-g) are reconnected.

Likewise, the centerline 42 indicated by ID=g has been connected to the centerline 42 indicated by ID=a, and after the rotation processing in step S303, since these centerlines are different in type, in this step S305, the processor 101 extends the Y coordinate y11 of the vertex of the rotated centerline 45 indicated by ID=g, which is a vertical line, to the Y coordinate y12 of the rotated centerline 45 indicated by ID=a, which is a horizontal line, as indicated by a thin solid line in FIG. 23. Up to this point, (a-b, b-c, a-c, c-d, d-e, c-e, f-a (f-h, h-a), f-g, g-a) are reconnected.

In this step S305, the processor 101 also connects the centerlines excluded in step S301 so that all the centerlines are to be reconnected.

As described above, in step S305, the reconnection method is uniquely determined in accordance with the type of each centerline (vertical or horizontal) and the connection state between the centerlines.

Figure 24:
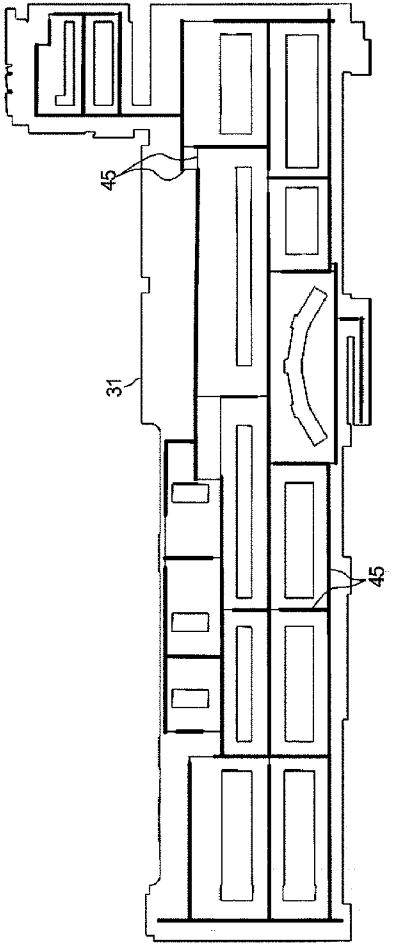
FIG. 24 is a schematic diagram illustrating an example of a result of the reconnection processing between the centerlines.

FIG. 24 is a diagram illustrating a result of this connection processing between the centerlines. In FIG. 24, the centerline extended to connect the centerlines 45 indicated by thick solid lines is indicated by a thin solid line.

Next, the processor 101 merges the overlapping centerlines, and when all the overlapping centerlines have been merged, the processor 101 divides the centerline at a contact point with the vertex (step S306).

The reconnection processing in step S305 described above creates a state where the centerlines 45 overlap with each other. For example, in the example illustrated in FIG. 23, since the centerline 45 indicated by ID=b, the centerline 45 indicated by ID=c, and the centerline 45 indicated by ID=d overlap with each other, the processor 101 merge these centerlines. There are various merging methods. For example, all the overlapping centerlines are obtained by performing overlap determination, and the maximum value and the minimum value (the Y coordinate when parallel to the X-axis, the X coordinate when parallel to the Y-axis) of these centerlines may be adopted. As a result of the merging described above, as illustrated in FIG. 25, the overlapping centerlines 45 indicated by IDs=b, c, and d can be represented as a centerline 45 with ID=b'.

Next, when the merging is completed, if the vertex of one centerline 45 is in contact with another centerline 45 at a point other than the vertex, or if the centerlines 45 intersect with one another, the processor 101 divides the centerline 45 at the contact point (or the intersection). For example, in the example in FIG. 25, since the centerline 45 indicated by ID=f is in contact with the centerline 45 indicated by ID=h, the processor 101 makes division at the contact point and creates a new centerline 45 with ID=i.

Likewise, since the centerline 45 indicated by this ID=i is in contact with the centerline 45 indicated by ID=g, the processor 101 makes division at the contact point and creates a new centerline 45 with ID=k. Further, since the centerline 45 indicated by this ID=k is in contact with the centerline 45 indicated by ID=a, the processor 101 makes division at the contact point and creates a new centerline 45 with ID=i.

Figure 25:
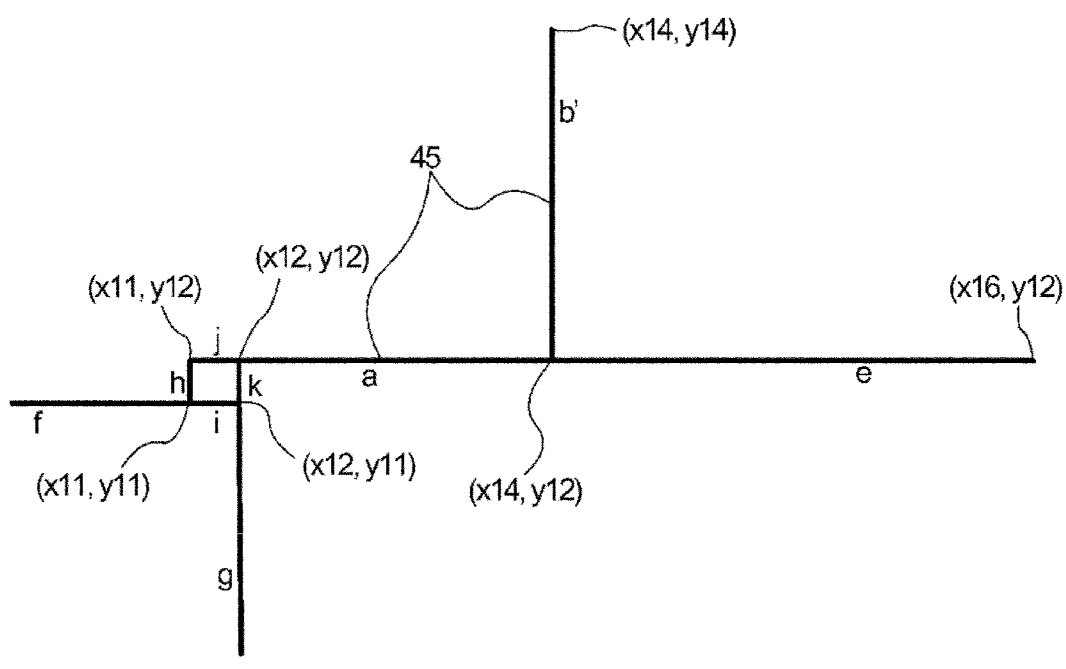
FIG. 25 is a schematic diagram for describing an example of merge and division processing of centerlines.

FIG. 25 illustrates the connection state between the centerlines after the new centerlines are created in this way.

Figure 26:
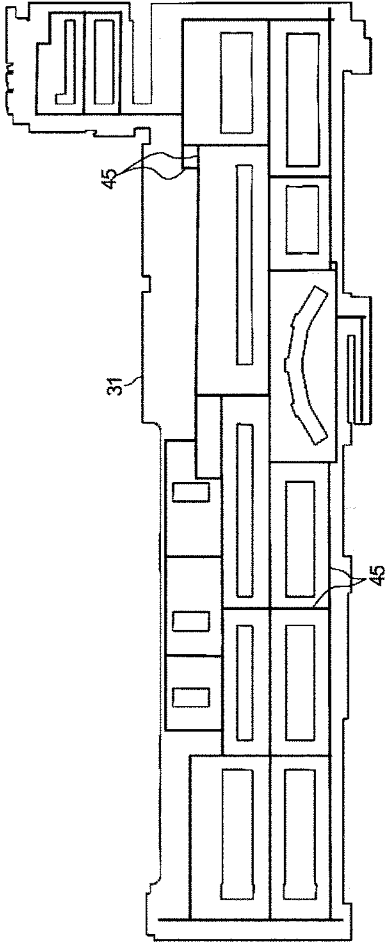
FIG. 26 is a schematic diagram illustrating an example of a result of the merge and division processing of the centerlines.

FIG. 26 is a diagram illustrating a result of this merge and division processing.

Next, the processor 101 removes any unnecessary centerline (step S307). In this processing for removing any unnecessary centerline, the processor 101 determines the centerline to be removed by using three kinds of removal determination methods described below and removes the determined centerline.

The first removal determination method relates to the removal determination made on the centerline that forms a closed polygon.

Figures 27A, 27B, 27C:
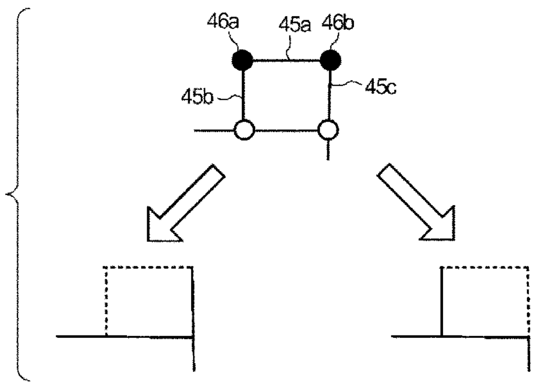
FIG. 27A is a schematic diagram for describing an example of centerline removal in a case where all vertices forming a closed polygon are in contact with three or more centerlines.
FIG. 27B is a schematic diagram for describing an example of centerline removal in a case where vertices of a closed polygon are in contact with two centerlines.
FIG. 27C is a schematic diagram for describing an example of centerline removal in a case where two vertices each of which is in contact with two centerlines exist.

As illustrated in FIG. 27A, when all vertices 46 of a closed polygon formed by a plurality of centerlines 45 are in contact with three or more centerlines 45, the processor 101 removes the centerline 45 that is the longest side of the closed polygon. In FIG. 27A and the drawings described below, the removed centerline is indicated by a dashed line.

As illustrated in FIG. 27B, when a vertex 46 of a closed polygon formed by a plurality of centerlines 45 is in contact with two centerlines 45, the processor 101 removes the centerlines 45 that include the vertex. In FIG. 27B, the black circle represents the vertex in contact with two centerlines 45. When there are a plurality of vertices each in contact with two centerlines 45 in the closed polygon, the processor 101 removes the side having the vertex in contact with the longest side. That is, as illustrated in FIG. 27C, when there are two vertices 46 each in contact with two centerlines 45, among the sides in contact with the vertex 46*a* and the vertex 46*b*, the longest side is the centerline 45*a* for both of the vertices. Thus, the processor 101 may remove either the centerlines 45*a* and 45*b* or the centerlines 45*a* and 45*c*.

Figure 27D:
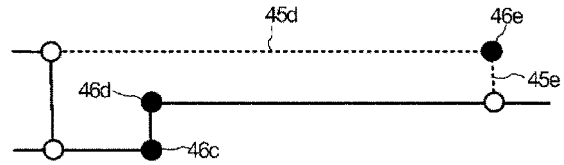
FIG. 27D is a schematic diagram for describing an example of centerline removal in a case where three vertices each of which is in contact with two centerlines exist.

As illustrated in FIG. 27D, when there are three vertices each in contact with two centerlines 45 (vertex 46*c*, vertex 46*d*, and vertex 46*e*), the processor 101 removes the centerline 45*d* and the centerline 45*e* that are the sides in contact with the vertex 46*e* that is in contact with longest side, which is the centerline 45*b*.

Figure 27E:
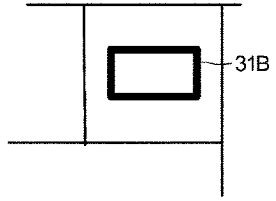
FIG. 27E is a schematic diagram for describing an example of centerline removal in a case where an inner frame of an original figure exists in a closed polygon.

As illustrated in FIG. 27E, when the inner frame 31B of the original figure is included in the closed polygon, no removal is performed, otherwise, the detour route disappears. However, if the inner frame 31B is small, the centerline may be removed, as long as the disappearance of the detour route does not create any problem.

Figure 28:
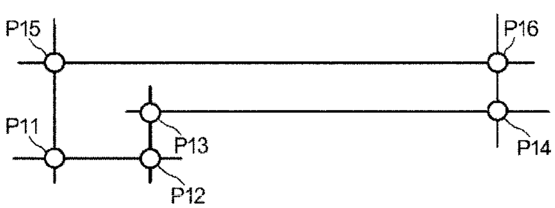
FIG. 28 is a schematic diagram illustrating an example of a closed polygon having six vertices each of which is in contact with three or more centerlines.

Here, the grounds for removing the centerline 45 that is the longest side will be described. The description will be made by using a closed polygon having six vertices P11 to P16 as illustrated in FIG. 28 as an example. That is, all the vertices 46 of the closed polygon formed by a plurality of centerlines 45 are in contact with three or more centerlines 45. With such a closed polygon, five patterns from pattern 1 to pattern 5 will be described. In each pattern, while the start point is fixed to the vertex P11, the end point changes to one of positions of the remaining five vertices P12 to P16.

Figure 29A:
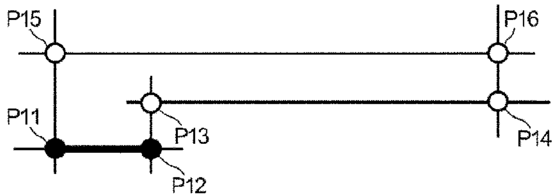
FIG. 29A is a schematic diagram illustrating the shortest path before centerline removal in pattern 1.
Figure 29B:
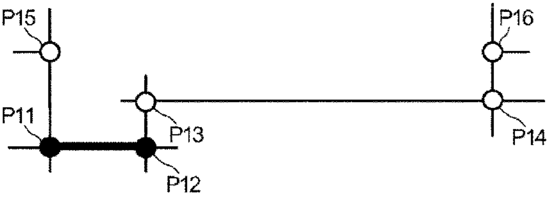
FIG. 29B is a schematic diagram illustrating the shortest path in a case where the longest centerline is removed in pattern 1.
Figure 29C:
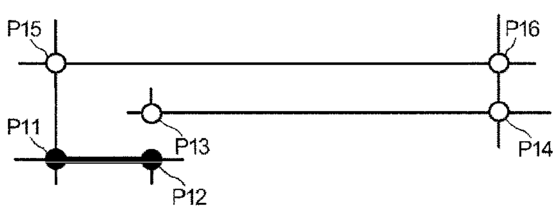
FIG. 29C is a schematic diagram illustrating the shortest path in a case where a centerline other than the longest centerline is removed in pattern 1.

FIGS. 29A to 29C illustrate the pattern 1 in which the end point is the vertex P12. FIG. 29A illustrates the shortest path before removing the centerline. FIG. 29B illustrates the shortest path when the longest centerline 45 has been removed. FIG. 29C illustrates the shortest path when the centerline 45 other than the longest centerline 45 has been removed.

Figure 30A:
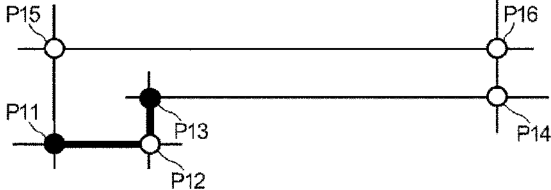
FIG. 30A is a schematic diagram illustrating the shortest path before centerline removal in pattern 2.
Figure 30B:
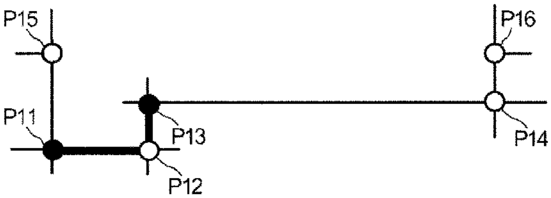
FIG. 30B is a schematic diagram illustrating the shortest path in a case where the longest centerline is removed in pattern 2.
Figure 30C:
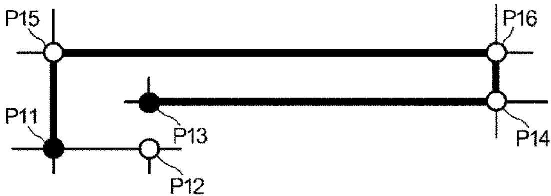
FIG. 30C is a schematic diagram illustrating the shortest path in a case where a centerline other than the longest centerline is removed in pattern 2.

FIGS. 30A to 30C illustrate the pattern 2 in which the end point is the vertex P13. FIG. 30A illustrates the shortest path before removing the centerline. FIG. 30B illustrates the shortest path when the longest centerline 45 has been removed. FIG. 30C illustrates the shortest path when the centerline 45 other than the longest centerline 45 has been removed.

Figure 31A:
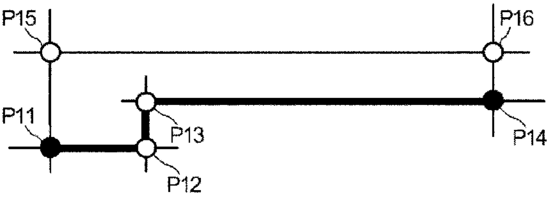
FIG. 31A is a schematic diagram illustrating the shortest path before centerline removal in pattern 3.
Figure 31B:
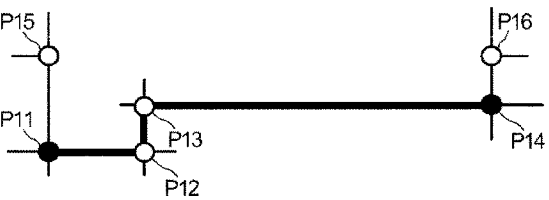
FIG. 31B is a schematic diagram illustrating the shortest path in a case where the longest centerline is removed in pattern 3.
Figure 31C:
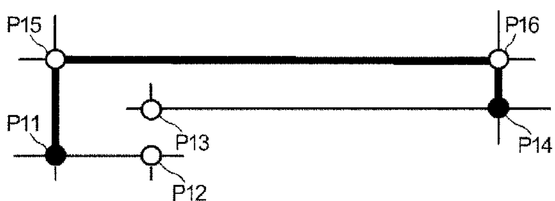
FIG. 31C is a schematic diagram illustrating the shortest path in a case where a centerline other than the longest centerline is removed in pattern 3.

FIGS. 31A to 31C illustrate the pattern 3 in which the end point is the vertex P14. FIG. 31A illustrates the shortest path before removing the centerline. FIG. 31B illustrates the shortest path when the longest centerline 45 has been removed. FIG. 31C illustrates the shortest path when the centerline 45 other than the longest centerline 45 has been removed.

Figure 32A:
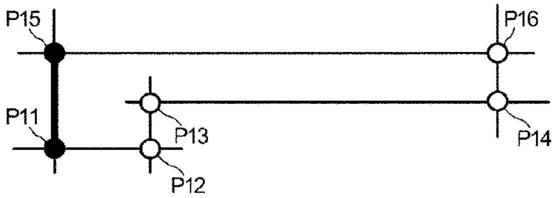
FIG. 32A is a schematic diagram illustrating the shortest path before centerline removal in pattern 4.
Figure 32B:
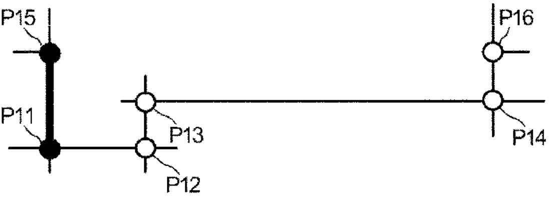
FIG. 32B is a schematic diagram illustrating the shortest path in a case where the longest centerline is removed in pattern 4.
Figure 32C:
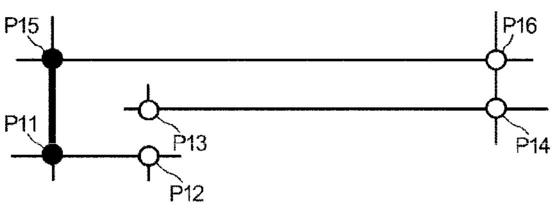
FIG. 32C is a schematic diagram illustrating the shortest path in a case where a centerline other than the longest centerline is removed in pattern 4.

FIGS. 32A to 32C illustrate the pattern 4 in which the end point is the vertex P15. FIG. 32A illustrates the shortest path before removing the centerline. FIG. 32B illustrates the shortest path when the longest centerline 45 has been removed. FIG. 39C illustrates the shortest path when the centerline 45 other than the longest centerline 45 has been removed.

Figure 33A:
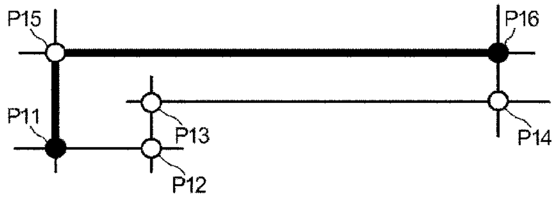
FIG. 33A is a schematic diagram illustrating the shortest path before centerline removal in pattern 5.
Figure 33B:
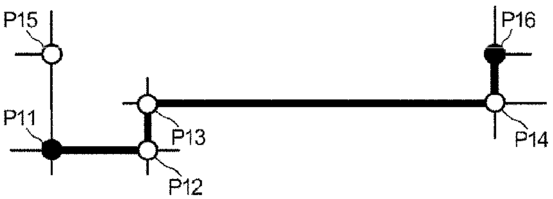
FIG. 33B is a schematic diagram illustrating the shortest path in a case where the longest centerline is removed in pattern 5.
Figure 33C:
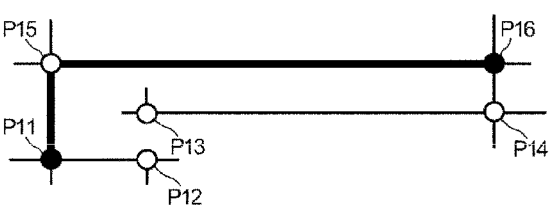
FIG. 33C is a schematic diagram illustrating the shortest path in a case where a centerline other than the longest centerline is removed in pattern 5.

FIGS. 33A to 33C illustrate the pattern 5 in which the end point is the vertex P16. FIG. 33A illustrates the shortest path before removing the centerline. FIG. 33B illustrates the shortest path when the longest centerline 45 has been removed. FIG. 33C illustrates the shortest path when the centerline 45 other than the longest centerline 45 has been removed.

From these drawings, even when the longest path is removed, there is no difference in the distance of the shortest path in the patterns 1, 4, and 5. However, in the patterns 2 and 3, it can be clearly seen that the distance of the shortest path is shorter when the longest path is removed. Incidentally, when both ends of the centerline 45 to be removed are set as the start point and the endpoint, the shortest path is always long, regardless of the length of the centerline 45. Thus, such a case is not considered here.

Figure 34:
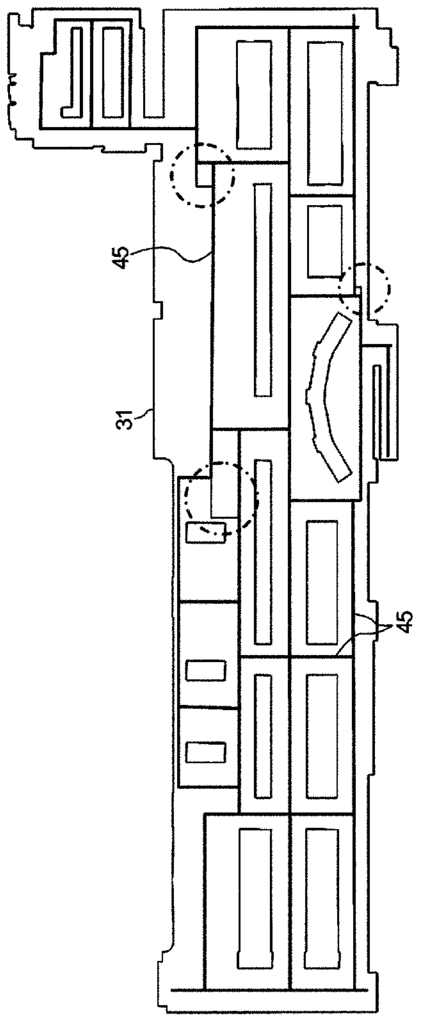
FIG. 34 is a schematic diagram illustrating an example of a result of removing unnecessary centerlines based on determination of removing centerlines forming a closed polygon.

FIG. 34 is a diagram illustrating a result of removing the unnecessary centerlines based on the removal determination made on the centerlines forming a closed polygon as described above. In FIG. 34, the centerlines 45 indicated by thin solid lines in portions each indicated by a dot-and-dash line circle are to be removed by this processing.

The second removal determination method relates to centerline removal determination in a case where only one centerline is in contact with the vertex.

Figure 35A:
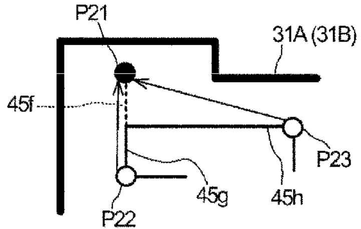
FIG. 35A is a schematic diagram for describing a case where a dead-end centerline is removed.

As illustrated in FIG. 35A, when only one centerline 45*f* is in contact with a vertex P21, the processor 101 sets the centerline 45*f* as a removal candidate. The removal candidate centerline is indicated by a dashed line.

In this case, the processor 101 determines whether the outer frame 31A or the inner frame 31B blocks the view of the source vertex P21 seen from vertices P22 and P23, which are the vertices on the other respective ends of the centerlines 45*g* and 45*h* connected to the removal candidate centerline 45*f*, that is, the processor 101 determines whether the visibility is good and the removal candidate centerline 45*f* has small importance for the path to the point of the vertex P21. As indicated by arrows in FIG. 35A, when the outer frame 31A or the inner frame 31B does not block the view of the vertex P21 from the vertices P22 and P23, the processor 101 removes the removal candidate centerline 45*f* in contact with the vertex P21.

Figure 35B:
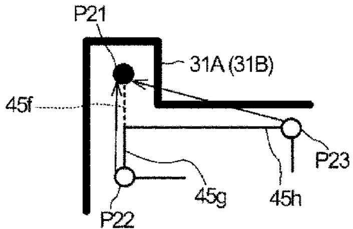
FIG. 35B is a schematic diagram for describing a case where a dead-end centerline is not removed.

In contrast, as indicated by arrows in FIG. 35B, when the outer frame 31A or the inner frame 31B blocks the view of the vertex P21 from any one of the vertices P22 and P23, in this example, from the vertex P23, the processor 101 does not remove the centerline 45*f*, which is the removal candidate in contact with the vertex P21. That is, since it is desirable to retain the centerline connected to the vertex located where the visibility is bad, that is, since the path to that point is meaningful, the removal is not performed.

Figure 36:
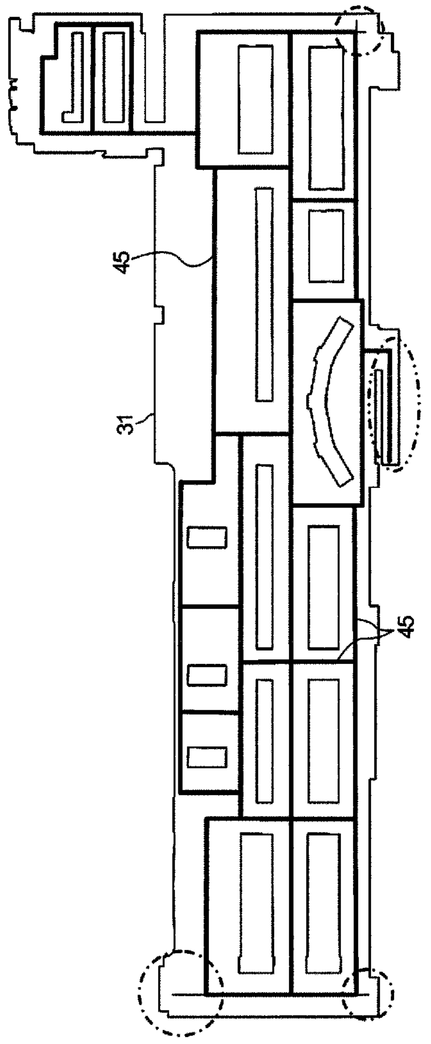
FIG. 36 is a schematic diagram illustrating an example of a result of removing unnecessary centerlines based on centerline removal determination in a case where only one centerline is in contact with a vertex.

FIG. 36 is a diagram illustrating a result of removing the unnecessary centerlines based on the centerline removal determination made in a case where only one centerline is in contact with the vertex as described above. In FIG. 36, the dead-end centerlines 45 exist in portions each indicated by a two-dot chain line circle, and the dead-end centerlines 45 indicated by thin solid lines in FIG. 36 are to be removed, while the dead-end centerline 45 indicated by a thick solid line is not to be removed by this processing.

The third removal determination method relates to centerline removal determination based on the rotation of the centerline.

The processor 101 does not remove the centerline that intersects the outer frame 31A or the inner frame 31B as a result of the rotation as illustrated in FIG. 19.

The processor 101 stores the result of removing the unnecessary centerline as described above in the post-correction centerline data storage unit 1038 as the centerline after the centerline correction.

Next, the processor 101 ends the group-by-group correction processing in step S3.

In this way, the processor 101 functions as the centerline correction unit 13.

Figure 37:
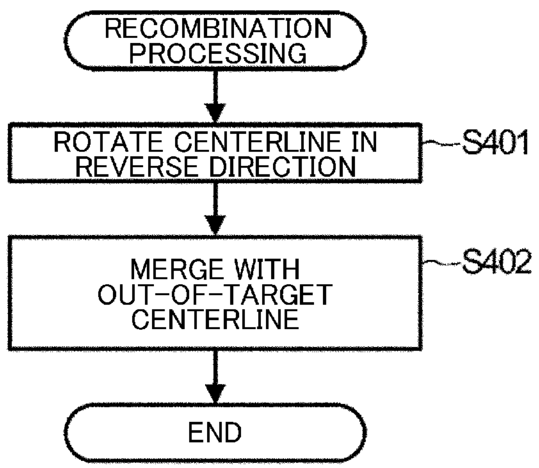
FIG. 37 is a flowchart illustrating an example of details of the recombination processing in FIG. 5.

FIG. 37 is a flowchart illustrating an example of the details of the recombination processing in step S4 described above. In this recombination processing, the processor 101 recombines the centerlines divided in step S1.

Figure 38:
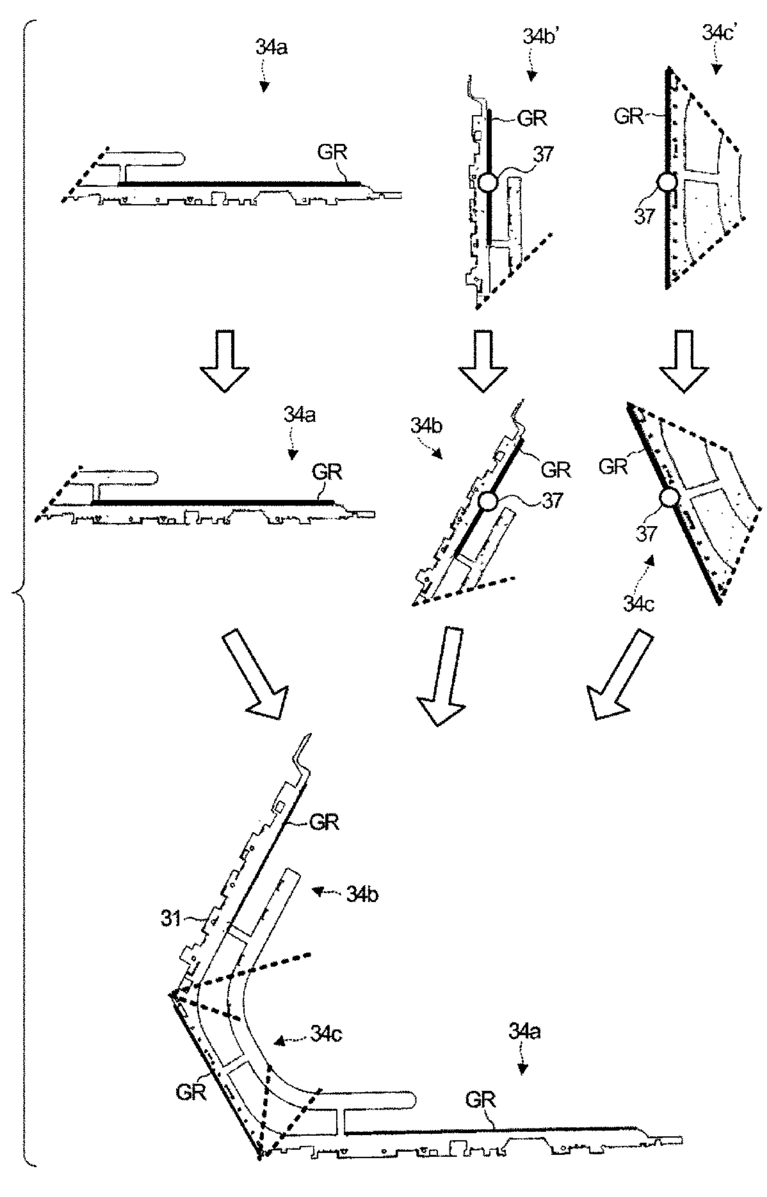
FIG. 38 is a schematic diagram for describing recombination of divided centerlines.

First, the processor 101 reads out the centerline after the centerline correction stored in the post-correction centerline data storage unit 1038 in step S3 and rotates the centerline in the reverse direction around the center point 37 of the reference line GR as illustrated in FIG. 38, in accordance with the reference line and the rotation angle per group, which is the information stored in the division information storage unit 1033 in step S1 (step S401). In FIG. 38, this reverse rotation is represented by using the group instead of the centerline since illustrating the individual centerlines makes it difficult to view.

Next, as illustrated in FIG. 38, the processor 101 merges the result of step S401 with the non-correction target centerlines stored in the non-correction-target centerline data storage unit 1034 in step S1 and stores the obtained result as centerline correction data in the centerline correction data storage unit 1039 (step S402). In FIG. 38, instead of representing the merge of the individual centerlines, the merge of the group regions 34*a*, 34*b*, and 34*c* and the out-of-group region 38 to form the original FIG. 31 is represented.

The processor 101 thus ends the recombination processing in step S4.

Figure 39:
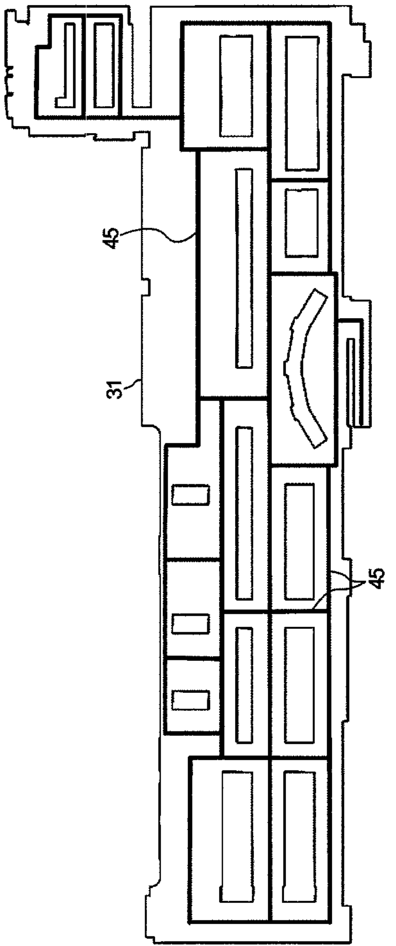
FIG. 39 is a schematic diagram illustrating an example of a relationship between shape information and a centerline after the centerline correction.

FIG. 39 is a schematic diagram illustrating an example of the relationship between the centerlines after the centerline correction stored in the post-correction centerline data storage unit 1038 and the shape information.

By causing the processor 101 to perform the processing of steps S1 to S4 described above, the centerline correction apparatus 10 according to the embodiment described above can eliminate a deviation of the centerline and correct the position of the centerline to an appropriate position without breaking the premise of the centerline, which is "the centerline that does not intersect the outer frame and the inner frame of the input shape of the indoor space, that can be formed by connecting straight lines from any internal position of the shape, and that is in an unbroken state", so as to be the source of spatial network data. That is, there can be provided a technique capable of correcting a centerline to be a simple and natural centerline that passes through the center of a path, without increasing the number of vertices and data of the centerline to be output as much as possible, by horizontally and vertically correcting the gradient of the centerline deviated by simplification correction, moving the centerline to be at the center with respect to a distance to the boundary of an original shape, and deleting the unnecessary centerline.

Thus, the network data generation apparatus 20 can generate network data that correctly reflects the actual path based on the centerline correction data stored in the centerline correction data storage unit 1039 of this centerline correction apparatus 10.

OTHER EMBODIMENT

While the case of correcting the centerline created based on the shape information about an indoor space has been described in the above embodiment, the centerline created based on road shape information about an outdoor space or the like can also be corrected in the same manner. That is, when spatial network data is generated, regardless of indoor or outdoor, suitable centerline correction can be performed.

In addition, the method described in each embodiment can be stored in a recording medium such as a magnetic disk (floppy (registered trademark) disk, hard disk, etc.), an optical disk (CD-ROM, DVD, MO, etc.), and a semiconductor memory (ROM, RAM, flash memory, etc.) or transmitted and distributed by a communication medium as a program (software means) executable by a computer. The program stored on the medium side also includes a setting program for configuring the software means (including not only the execution program but also the table and the data structure) in a computer to be executed by the computer. The computer that implements the present apparatus reads the program recorded on a recording medium, constructs software means by the setting program in some cases, and executes the above-described processing by controlling the operation by this software means. The recording medium referred to in the present description is not limited to a recording medium for distribution but includes a storage medium such as a magnetic disk and a semiconductor memory provided in a device connected inside a computer or via a network.

In short, the present invention is not limited to the above embodiments, and various modification can be made in practice without departing from the scope of the present invention. In addition, each embodiment may be carried out in combination as appropriate as possible, in which case, combined effects can be obtained. Further, the above embodiments include various stages of invention, and various inventions can be extracted by appropriately combining a plurality of constituent features disclosed.

REFERENCE SIGNS LIST

10 Centerline correction apparatus
11 Straight line extraction unit
12 Region generation unit
13 Centerline correction unit
20 Network data generation apparatus
30 Centerline generation source data storage device
31 FIG.
31A Outer frame
31B Inner frame
33, 46, 46*a* to 46*e*, 441, 442, 461, 462, P11 to P16, P21 to P23 Vertex
34, 34*a*, 34*b*, 34*b*', 34*c*, 34*c*', 34*d* to 34*n* Region
35 Circumscribed rectangle
36, 321 to 326, 361 to 367 Straight line
37, 43 Center point
38 Out-of-group region
40 Centerline data storage device
41, 42, 45, 45*a* to 45*g*, 421, 422, 451 to 453 Centerline
47', 471, 473' Position
101 Processor
102 Program memory
103 Data memory
104 Communication interface
105 Input/output interface
106 Bus
107 Input unit
108 Display unit
1031 Centerline generation source data storage unit
1032 Centerline data storage unit
1033 Division information storage unit
1034 Non-correction-target centerline data storage unit
1035 Post-division centerline generation source data storage unit
1036 Post-division centerline data storage unit
1037 Centerline connection state storage unit
1038 Post-correction centerline data storage unit
1039 Centerline correction data storage unit
311 Figure
GR Reference line

The invention claimed is:

1. A centerline correction apparatus configured to correct a centerline of a path that is acquired from shape information about an indoor space or road shape information about an outdoor space and that is a travelable region in the indoor space or the outdoor space, the centerline correction apparatus comprising:
at least one memory and
one or more processors configured to perform operations including:
extracting a center point of an individual side of the centerline;
moving the centerline to be at a center with respect to a distance to a boundary of an original shape based on the extracted center point by rotating the individual side of the centerline around the center point, and translating the rotated centerline; and
deleting an unnecessary one of the moved centerlines.

2. The centerline correction apparatus according to claim 1, wherein the one or more processors are configured to perform operations further comprising:
dividing an outer frame shape of the path;
extracting straight line portions of the outer frame shape in order of length;
grouping the straight line portions based on respective angles formed by the extracted straight line portions and a reference line and that generates a region per group with a plurality of the straight line portions included in each group; and
performing the correction of the centerline per region.

3. The centerline correction apparatus according to claim 2, wherein the one or more processors are configured to perform the centerline correction process by performing operations including:
excluding the region from a correction target of the centerline correction process when an area of the region is equal to or less than a threshold; and removing, when different ones of the regions overlap with each other, a smaller region from a figure included in a larger region and further performs division of the region.

4. The centerline correction apparatus according to claim 3, wherein the one or more processors are configured to perform a division process that translates, along a circumscribed rectangle of the larger region, a straight line parallel to the reference line from one end to the other end of the circumscribed rectangle and divides the larger region at a position where a significant change occurs in the region to be divided.

5. A centerline correction method performed by a centerline correction apparatus which corrects a centerline of a path that is acquired from shape information about an indoor space or road shape information about an outdoor space and that is a travelable region in the indoor space or the outdoor space, the centerline correction method, comprising:

extracting a center point of an individual side of the centerline;

moving the centerline to be at a center with respect to a distance to a boundary of an original shape based on the extracted center point by rotating the individual side of the centerline around the center point, and translating the rotated centerline; and deleting an unnecessary one of the moved centerlines.

6. A network data generation system comprising:

at least one memory; and one or mor processors configured to perform operations comprising:

generating spatial network data which is information about a path based on a centerline corrected by at least one of the one or more processors;

extracting a center point of an individual side of the centerline;

moving the centerline to be at a center with respect to a distance to a boundary of an original shape based on the extracted center point by rotating the individual side of the centerline around the center point, and translating the rotated centerline; and deleting an unnecessary one of the moved centerlines.

* * * * *